US011474144B2

(12) United States Patent
Lin et al.

(10) Patent No.: US 11,474,144 B2
(45) Date of Patent: Oct. 18, 2022

(54) METHOD FOR INSPECTING LIGHT-EMITTING DIODES AND INSPECTION APPARATUS

(71) Applicant: Industrial Technology Research Institute, Hsinchu (TW)

(72) Inventors: Yan-Rung Lin, Hsinchu (TW); Chung-Lun Kuo, New Taipei (TW); Chih-Hsiang Liu, Hsinchu County (TW); Shie-Chang Jeng, Tainan (TW)

(73) Assignee: Industrial Technology Research Institute, Hsinchu (TW)

( * ) Notice: Subject to any disclaimer, the term of this patent is extended or adjusted under 35 U.S.C. 154(b) by 288 days.

(21) Appl. No.: 16/907,120

(22) Filed: Jun. 19, 2020

(65) Prior Publication Data
US 2020/0371152 A1    Nov. 26, 2020

Related U.S. Application Data

(63) Continuation-in-part of application No. 16/231,607, filed on Dec. 24, 2018, now Pat. No. 11,002,783.

(30) Foreign Application Priority Data

Dec. 21, 2018  (TW) .................................. 107146378

(51) Int. Cl.
*G01R 31/26* (2020.01)
*G01R 31/27* (2006.01)
(Continued)

(52) U.S. Cl.
CPC ......... *G01R 31/2635* (2013.01); *G01N 21/17* (2013.01); *G01N 21/6489* (2013.01); *G01R 31/27* (2013.01); *G01N 2021/1765* (2013.01)

(58) Field of Classification Search
CPC ........ G01R 31/26; G01R 31/27; G01N 21/64; G01N 21/17
See application file for complete search history.

(56) References Cited

U.S. PATENT DOCUMENTS

| 5,459,409 A | 10/1995 | Henley |
| 2005/0068057 A1 | 3/2005 | Iwasaki et al. |

(Continued)

FOREIGN PATENT DOCUMENTS

| CN | 101561475 | 10/2009 |
| CN | 101581760 | 11/2009 |

(Continued)

OTHER PUBLICATIONS

"Office Action of Taiwan Counterpart Application", dated Nov. 17, 2021, p. 1-p. 4.

*Primary Examiner* — Alvaro E Fortich
*Assistant Examiner* — Zannatul Ferdous
(74) *Attorney, Agent, or Firm* — JCIPRNET

(57) ABSTRACT

An inspection apparatus including an illumination light source, a sensing probe and a processing device is provided. The illumination light source emits an illumination beam to simultaneously irradiate the plurality of light-emitting diode. The sensing probe is configured to measure a charge distribution, an electric field distribution, or a voltage distribution on the plurality of light-emitting diodes simultaneously irradiated by the illumination beam. The processing device determines a plurality of electro-optical characteristics of the plurality of light-emitting diodes through the charge distribution, the electric field distribution, or the voltage distribution on the plurality of light-emitting diodes simultaneously irradiated by the illumination beam. Moreover, a method of for inspecting light-emitting diodes is also provided.

32 Claims, 28 Drawing Sheets

(51) Int. Cl.
  *G01N 21/64* (2006.01)
  *G01N 21/17* (2006.01)

(56) References Cited

U.S. PATENT DOCUMENTS

2013/0027543 A1* 1/2013 Boeykens .......... G01R 31/2656
  348/92
2020/0335847 A1* 10/2020 Säily ................... H01Q 21/205

FOREIGN PATENT DOCUMENTS

| CN | 104569779 | 4/2015 |
| TW | 201841275 | 11/2018 |
| TW | 201841278 | 11/2018 |
| TW | 201907178 | 2/2019 |

\* cited by examiner the variation of the charge, the electric field or the voltage across the media layer the variation of the charge, the electric field or the voltage across the media layer

METHOD FOR INSPECTING LIGHT-EMITTING DIODES AND INSPECTION APPARATUS

CROSS-REFERENCE TO RELATED APPLICATION

This application is a continuation-in-part application of and claims the priority benefit of U.S. application Ser. No. 16/231,607, filed on Dec. 24, 2018, now pending, which claims the priority benefit of Taiwan application serial no. 107146378, filed on Dec. 21, 2018. The entirety of each of the above-mentioned patent applications is hereby incorporated by reference herein and made a part of this specification.

TECHNICAL FIELD

The disclosure relates to a method for inspecting light-emitting diodes (LEDs) and an inspection apparatus.

BACKGROUND

With the development of the light-emitting diode (LED) display technology, the size of the LED die has been gradually reduced to micrometers (μm). In case of transferring a significant amount of the LEDs, high yields of the LEDs must be ensured to avoid subsequent repair of the back-end products. If the size of the LED dies is extremely small, it is almost unlikely to perform the repairing action, which causes defects in the display, affects the process yield, and further poses a negative impact on costs. Therefore, how to screen out the normal function dies, or further screen out the LED dies into groups according to a specified criterion is an important inspection technology.

As the overall size of the LEDs is reduced, the size of the electrodes of the LEDs is also reduced. Therefore, when detecting the LEDs, the probe of the inspection apparatus is not easily aligned with the electrodes of the LEDs, and the tip of the probe needs to have a very small size so as to match the size of the electrodes of the LEDs. It is not easy to manufacture the probe with a very small tip, and the tip of the probe needs to be in contact with the electrodes of the LEDs during the inspection process; therefore, the probe is very likely to be damaged. In addition, in a general inspection method, the probe is required to be sequentially in contact with the electrodes of the LEDs, and thus the inspection process takes time and labor.

SUMMARY

The disclosure provides a method for inspecting light-emitting diodes (LEDs), so as to rapidly inspect a significant amount of LEDs.

In an embodiment of the disclosure, an inspection apparatus configured to inspect a plurality of light-emitting diodes includes an illumination light source, a sensing probe and a processing device. The illumination light source emits an illumination beam to simultaneously irradiate the plurality of light-emitting diode. The sensing probe is configured to measure a charge distribution, an electric field distribution, or a voltage distribution on the plurality of light-emitting diodes simultaneously irradiated by the illumination beam. The processing device determines a plurality of electro-optical characteristics of the plurality of light-emitting diodes through the charge distribution, the electric field distribution, or the voltage distribution on the plurality of light-emitting diodes simultaneously irradiated by the illumination beam. The illumination beam has a sufficient light intensity so that the charge distribution, the electric field distribution, or the voltage distribution on the plurality of light-emitting diodes simultaneously illuminated by the illumination beam are close to a saturation charge distribution, a saturation electric field distribution or a saturation voltage distribution, respectively. The sensing probe is used to measure the charge distribution, the electric field distribution or the voltage distribution on the plurality of light-emitting diodes simultaneously illuminated by the illumination beam. The processing device determines luminous energies of the plurality of light-emitting diodes operated under a constant current according to the charge distribution, the electric field distribution or the voltage distribution on the plurality of light-emitting diodes simultaneously illuminated by the illumination beam.

In an embodiment of the disclosure, an inspection apparatus configured to inspect a plurality of light-emitting diodes includes an illumination light source, a sensing probe and a processing device. The illumination light source emits an illumination beam to simultaneously irradiate the plurality of light-emitting diode. The sensing probe is configured to measure a charge distribution, an electric field distribution, or a voltage distribution on the plurality of light-emitting diodes simultaneously irradiated by the illumination beam. The processing device determines a plurality of electro-optical characteristics of the plurality of light-emitting diodes through the charge distribution, the electric field distribution, or the voltage distribution on the plurality of light-emitting diodes simultaneously irradiated by the illumination beam. A light intensity of the illumination beam changes with time, so that the charge distribution, the electric field distribution, or the voltage distribution on the plurality of light-emitting diodes change with time, and the charge distribution, the electric field distribution, or the voltage distribution that changes with time causes a magnetic field distribution. The sensing probe measures the magnetic field distribution. The processing device determines the plurality of electro-optical characteristics of the plurality of light-emitting diodes according the magnetic field distribution.

In an embodiment of the disclosure, a method for inspecting light-emitting diodes, comprising: emitting an illumination beam to simultaneously irradiate the plurality of light-emitting diodes; measuring a charge distribution, an electric field distribution, or a voltage distribution on the plurality of light-emitting diodes simultaneously irradiated by the illumination beam; determining a plurality of electro-optical characteristics of the plurality of light-emitting diodes through the charge distribution, the electric field distribution, or the voltage distribution on the plurality of light-emitting diodes simultaneously irradiated by the illumination beam; keeping a calibration sheet and a sensing probe at a fixed distance; forming a set of controllable correction charge distributions, a set of controllable correction electric field distributions or a set of controllable correction voltage distributions on the calibration sheet; measuring the set of the controllable correction charge distributions, the set of the controllable correction electric field distributions or the set of the controllable correction voltage distributions by the sensing probe; obtaining a set of calibration parameters according the set of the controllable correction charge distributions, the set of the controllable correction electric field distributions or the set of the controllable correction voltage distributions; and correcting the charge distribution, the electric field distribution, or the voltage distribution on the plurality of light-emitting diodes measured by the sensing probe according to the set of the calibration parameters.

In view of the above, in the inspection apparatus provided in one or more embodiments of the disclosure, the illumination beam is applied to simultaneously irradiate the LEDs, and a sensing probe is applied to measure the charge distribution, the electric field distribution, or the voltage distribution on the LEDs, so as to determine the electro-optical characteristics of the LEDs. As such, a significant amount of LEDs can be rapidly inspected.

Several exemplary embodiments accompanied with figures are described in detail below to further describe the disclosure in details.

DETAILED DESCRIPTION OF DISCLOSED EMBODIMENTS

Figure 1:
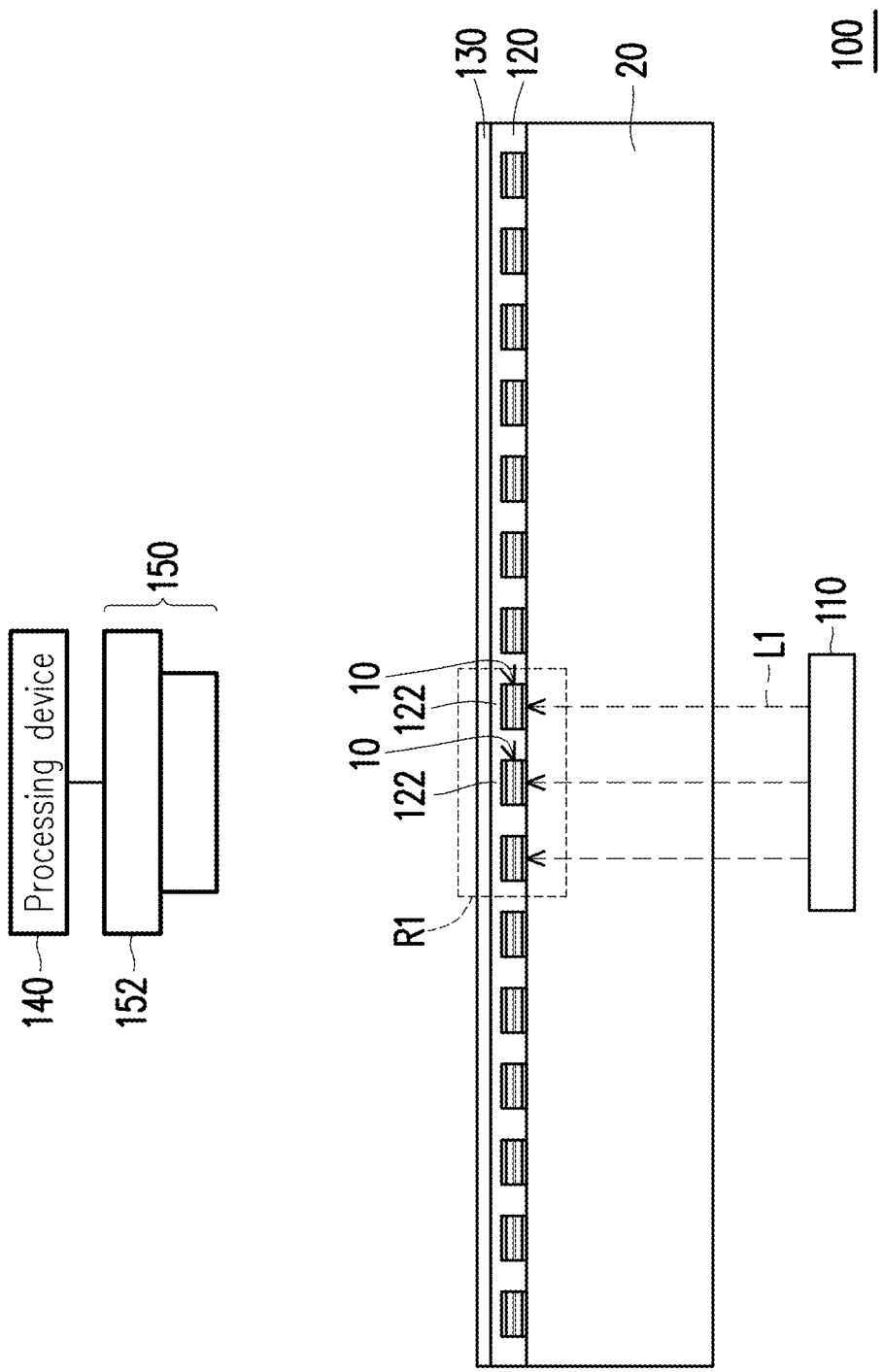
FIG. 1 is a schematic view of an inspection apparatus 100 according to an embodiment of the disclosure.

Descriptions provided in the disclosure are given with reference to the exemplary embodiments illustrated with accompanied drawings, wherein same or similar parts are denoted with same reference numerals. Wherever possible, the same reference numbers are used in the drawings and the description to refer to the same or like parts.

Figure 2:
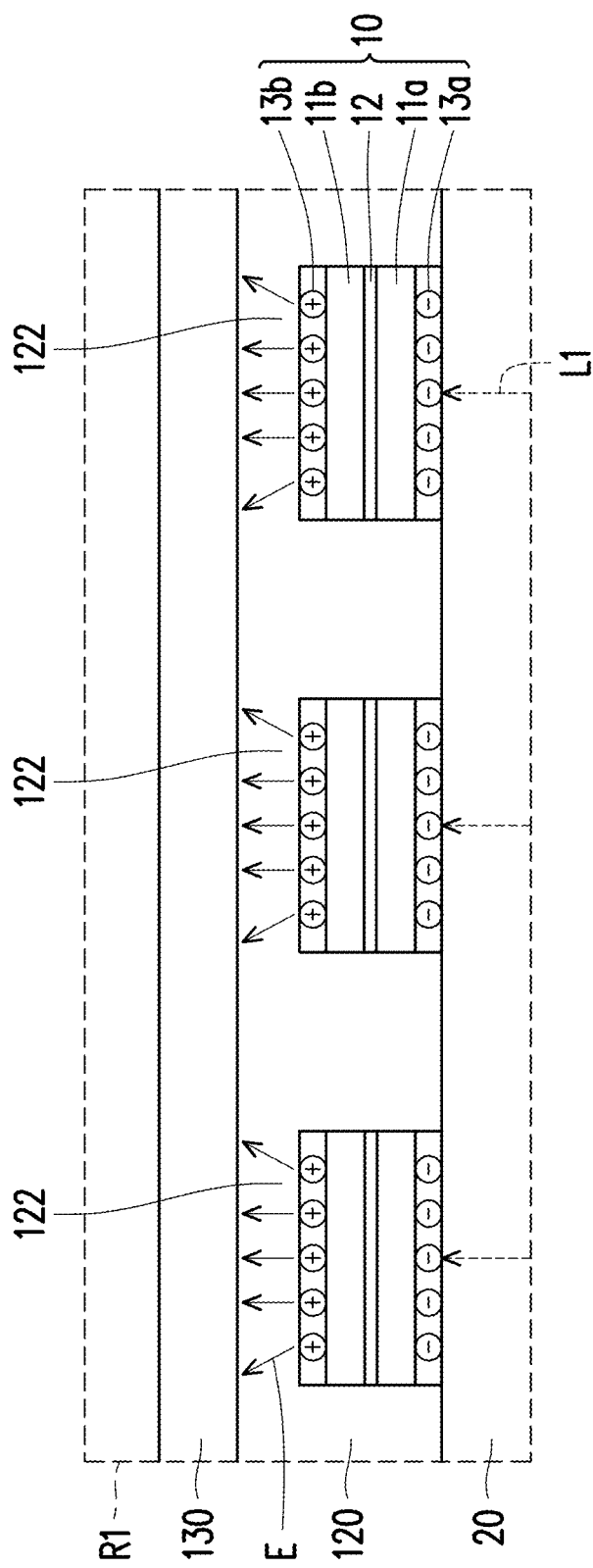
FIG. 2 is a schematic enlarged view of the partial region R1 depicted in FIG. 1.

FIG. 1 is a schematic view of an inspection apparatus 100 according to an embodiment of the disclosure. FIG. 2 is a schematic enlarged view of the partial region R1 depicted in FIG. 1.

With reference to FIG. 1, the inspection apparatus 100 is configured to inspect a plurality of light-emitting diodes (LEDs) 10. The LEDs 10 may be micro LEDs, mini LEDs, or LEDs of other sizes. In the present embodiment, the to-be-tested LEDs 10 can be selectively disposed on a carrier 20. For instance, the carrier 20 may be a wafer, which should however not be construed as a limitation in the disclosure.

With reference to FIG. 2, the LED 10 includes a first-type semiconductor layer 11a, a second-type semiconductor layer 11b, an active layer 12 disposed between the first-type semiconductor layer 11a and the second-type semiconductor layer 11b, an electrode 13a adjacent to the first-type semiconductor layer 11a, and an electrode 13b adjacent to the second-type semiconductor layer 11b. For instance, in the present embodiment, the two electrodes 13a and 13b of the LED 10 can be respectively disposed on two opposite sides of the first-type semiconductor layer 11a. That is, in the present embodiment, the LED 10 is a vertical LED, for instance. This should however not be construed as a limitation in the disclosure; according to other embodiments, the LED 10 may also be a horizontal LED, a flip-chip LED, or an LED of other types.

With reference to FIG. 1 and FIG. 2, in the present embodiment, the inspection apparatus 100 may selectively include a medium layer 120. The medium layer 120 is adapted to be affected by an electric field E (depicted in FIG. 2), a charge, or a voltage to induce a corresponding optical property change. The medium layer 120 is disposed on or over the LEDs 10. The medium layer 120 adjoins the LEDs 10 and has a plurality of inspection regions 122 respectively corresponding to the LEDs 10. For instance, each inspection region 122 may refer to a portion of the medium layer 120 overlapped with a corresponding LED 10. Alternatively, in the present embodiment, the medium layer 120 may be directly disposed on the LEDs 10. The medium layer 120 is, for instance, formed on the LEDs 10 through coating. Namely, the medium layer 120 can selectively be in contact with the LEDs 10. This should however not be construed as a limitation in the disclosure; according to other embodiments, the medium layer 120 may also be formed on the LEDs in another manner, and it is also likely for the medium layer 120 not to be direct contact with the LEDs. In brief, the medium layer 120 should be disposed at a location where can be affected by the electric field E, the charge, or the voltage to induce the corresponding optical property change.

In the present embodiment, the inspection apparatus 100 can selectively include a conductive layer 130. The conductive layer 130 is disposed on the medium layer 120, and the medium layer 120 is located between the conductive layer 130 and the LEDs 10. In the present embodiment, the conductive layer 130 is transparent and is selectively connected to electrodes 13a of the LED 10, which should however not be construed as a limitation in the disclosure.

The inspection apparatus 100 includes an illumination light source 110. The illumination light source 110 is configured to emit an illumination beam L1, so as to simultaneously irradiate the LEDs 10. The wavelength of the illumination beam L1 is less than or equal to a light-emitting wavelength of the LEDs 10. The illumination beam L1 can induce photovoltaic effects of the LEDs 10. In the present embodiment, the illumination beam L1 may selectively have uniform light intensity. Namely, the irradiated amount of each LED 10 simultaneously irradiated by the illumination beam L1 is substantially the same, which should however not be construed as a limitation in the disclosure.

In the present embodiment, the illumination light source 110 can be selectively disposed below the LEDs 10, and the illumination beam L1 can irradiate the LEDs 10 from the surfaces of the LEDs 10, which face the illumination light source 110. This should however not be construed as a limitation in the disclosure; according to other embodiments, the illumination light source 110 can also be disposed at another proper location, and the illumination beam L1 can also irradiate the LEDs 10 from the front surface, the side surfaces, or both of the LEDs 10.

In the present embodiment, the inspection apparatus 100 may also include a processing device 140 and an optical image capturing portion 150. The optical image capturing portion 150 at least includes an optical-electro sensor 152 and an image capturing light source 154 (shown in at least one of FIG. 6A to FIG. 8B), wherein the image capturing light source 154 emits an image capturing beam L2 (shown in at least one of FIG. 6A to FIG. 8B) to irradiate the medium layer 120. The optical-electro sensor 152 and the processing device 140 are electrically connected. For instance, in the present embodiment, the optical image capturing portion 150 may include a camera and an image capturing lens assembly, and the processing device 140 may be a computer, which should however not be construed as a limitation in the disclosure.

The processing device 140 determines a plurality of electro-optical characteristics of the LEDs 10 through the charge distribution, the electric field distribution, or the voltage distribution on the LEDs 10 simultaneously irradiated by the illumination beam L1. For instance, in the present embodiment, when the illumination beam L1 simultaneously irradiate the LEDs 10, charges are accumulated on the electrode 13b of at least one of the LEDs 10, and the accumulated charges induce the electric field E and the voltage. The medium layer 120 is affected by the electric field E, the charge, or the voltage and thus induces physical or chemical changes, which leads to the corresponding optical property change to the medium layer 120. The optical-electro sensor 152 obtains an image of inspection regions 122 of the medium layer 120 corresponding to the LEDs 10 when the illumination beam L1 simultaneously irradiates the LEDs 10. The processing device 140 determines electro-optical characteristics of the LEDs 10 according to the image.

For instance, if the LED 10 is operated normally, due to the photovoltaic effect, a voltage difference is generated between the two electrodes 13a and 13b of the functional LED 10, and the electric field E may be generated between the electrode 13b of the LED 10 and the conductive layer 130 located on the medium layer 120; affected by the electric field E, the charge, or the voltage, a portion of the image of the inspection regions 122 of the medium layer 120 corresponding to the functional LED 10 is a portion of a predicted image (e.g., bright zone). By contrast, if the LED 10 cannot work, no voltage can be generated between the electrodes 13a and 13b of the non-functional LED 10, and no electric field E, charge, or voltage is generated between the electrode 13b of the non-functional LED 10 and the conductive layer 130 located on the medium layer 120. At this time, a portion of the image of the inspection regions 122 of the medium layer 120 corresponding to the non-functional LED 10 is a portion of an unpredicted image (e.g., dark zone). Thereby, it can be determined whether the LED 10 is functional.

It should be mentioned that in the aforesaid inspection method, the illumination light source 110 simultaneously irradiates a plurality of LEDs 10, and the optical-electro sensor 152 simultaneously obtains the image of the inspection regions 122 of the medium layer 120. Unlike the normal inspection apparatus, the inspection apparatus 100 need not have the probe sequentially contacted with the electrodes 13b of the LEDs 10. Accordingly, a significant amount of LEDs 10 can be rapidly inspected. Moreover, in said inspection method, the steps of irradiating the LEDs 10 and obtaining the image of the inspection regions 122 do not require the actual contact with the LEDs 10; therefore, the possibility of damaging the LEDs 10 during the inspection can be reduced. Besides, the probe used when applying the normal inspection method is required to be aligned to the electrodes of the LEDs, and thus the tip of the probe may be worn. Said issue can be prevented in the disclosure.

Figure 3:
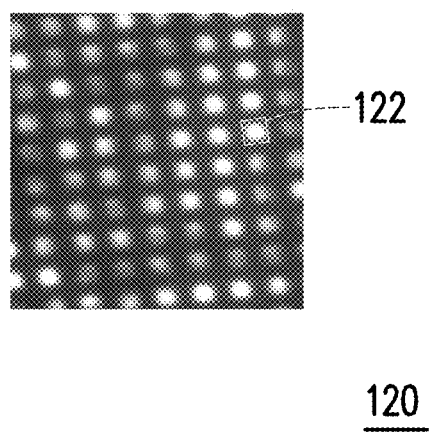
FIG. 3 is an image of the medium layer 120 according to an embodiment of the disclosure.

FIG. 3 shows an image of the medium layer 120 according to an embodiment of the disclosure. With reference to FIG. 2 and FIG. 3, in this embodiment, during the inspection process of the light-emitting diodes 10, the medium layer 120 may be pixelated by the electrodes 13b of the plurality of light-emitting diodes 10. In other words, the plurality of inspection regions 122 of the medium layer 120 can be regarded as a plurality of pixels that can indicate the electro-optical characteristics of the plurality of light-emitting diodes 10, respectively.

Note that the method of inspecting the LEDs 10 and the inspection apparatus 100 not only can inspect whether the LEDs 10 normally function but also can be applied to inspect the electro-optical characteristics of the LEDs 10. For instance, due to the manufacturing variations, the electro-optical characteristics of the LEDs 10 are different; at this time, when the illumination beam L1 with the same intensity is applied to irradiate the LEDs 10, the electric fields, the charges, or the voltages generated by the LEDs 10 are different, and thus the changes of optical properties of the medium layer 120 are in different degrees; as such, the brightness or the colors of portions of the image of the inspection regions 122 respectively corresponding to the LEDs 10 are different. Thereby, whether the electro-optical characteristics of the LEDs 10 are good or not, and the LEDs 10 can then be classified.

Figure 4:
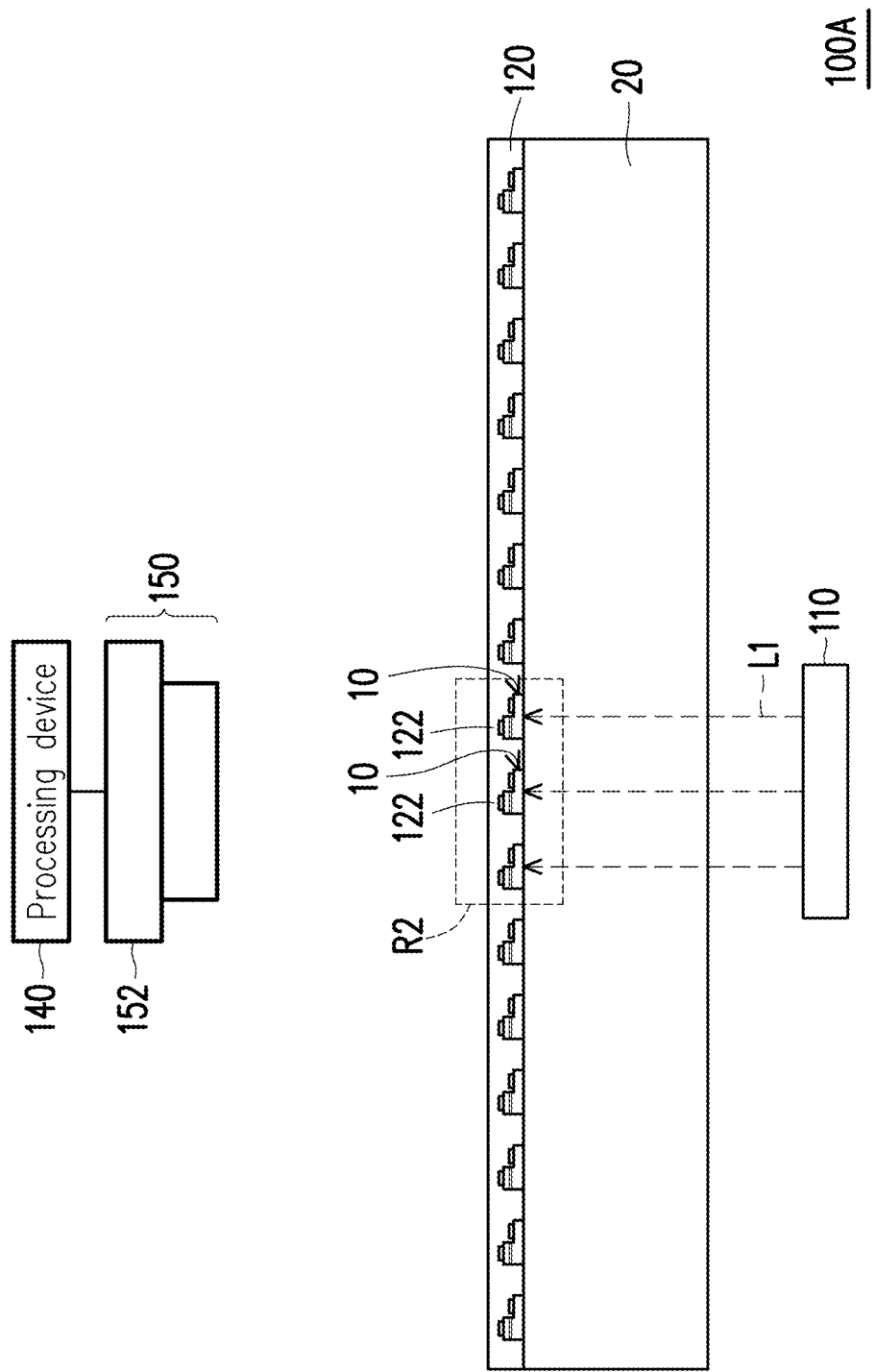
FIG. 4 is a schematic view of an inspection apparatus 100A according to another embodiment of the disclosure.
Figure 5:
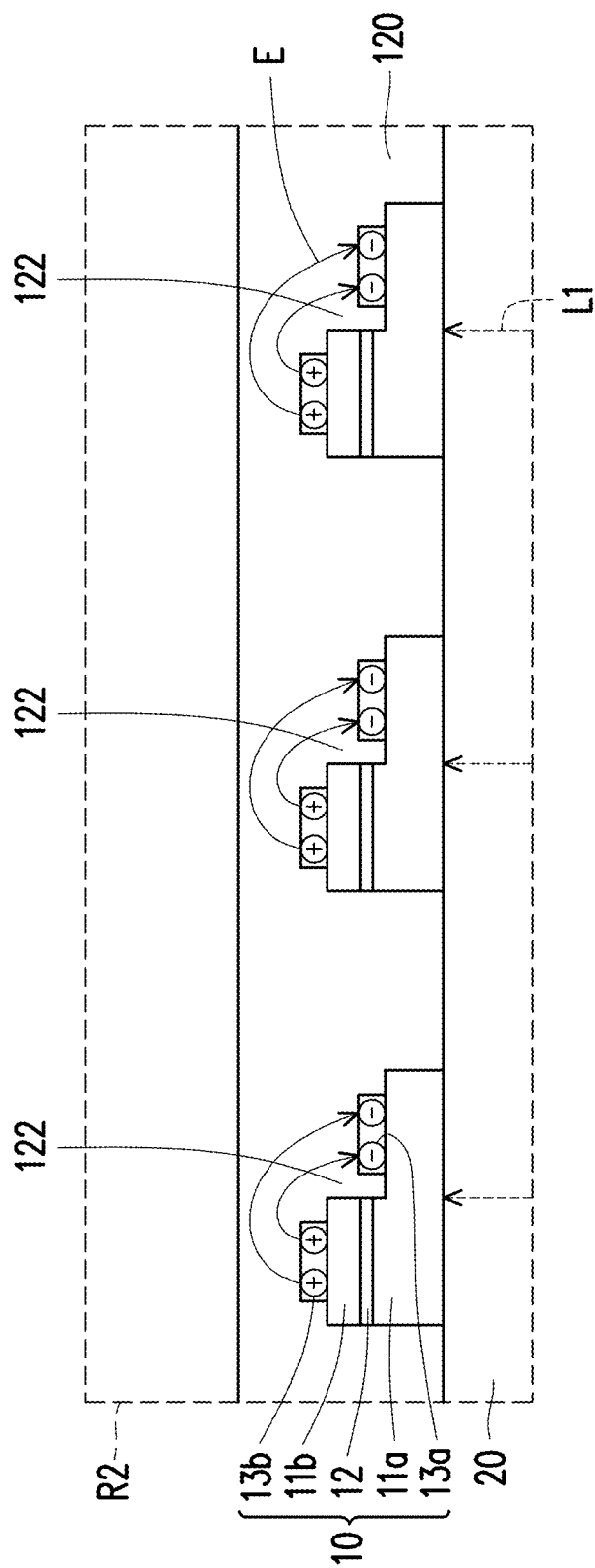
FIG. 5 is a schematic enlarged view of the partial region R2 depicted in FIG. 4.

FIG. 4 is a schematic view of an inspection apparatus 100A according to another embodiment of the disclosure. FIG. 5 is a schematic enlarged view of the partial region R2 depicted in FIG. 4. The inspection apparatus 100A and a method for inspecting the same provided in the present embodiment are similar to the inspection apparatus 100 and the method for inspecting the same, while the difference therebetween lies in that the inspection apparatus 100A is adapted to inspect the horizontal LEDs 10. The two electrodes 13a and 13b of the horizontal LED 10 are located on the same side of the first-type semiconductor layer 11a. In the present embodiment, the medium layer 120 may be affected by the electric field E, the charge, or the voltage generated by the two electrodes 13a and 13b of the horizontal LED 10, and there may be no conductive layer 130 on the medium layer 120. According to the embodiment depicted in FIG. 4, the optical image capturing portion 150 of the inspection apparatus 100A also includes an image capturing light source 154 (depicted in at least one of FIG. 6A to FIG. 8B), wherein the image capturing light source 154 emits the image capturing beam L2 (depicted in at least one of FIG. 6A to FIG. 8B) to irradiate the medium layer 120.

The medium layer 120 provided in any of the previous embodiments may be a film layer capable of affecting by the electric field E, the charge, or the voltage to experience the physical or chemical changes, which induces the corresponding optical property change. For instance, the medium layer 120 may be a liquid crystal (LC) layer, an electrochromic(EC) layer, an electro-wetting layer, a suspended particle device (SPD) layer, voltage-sensing nanoparticles, or a voltage sensitive dye, a quantum dot material or other materials. Here, the LC layer may be a polymer dispersed liquid crystal (PDLC) layer, a twisted nematic liquid crystal (TNLC) layer, a super twisted nematic (STN) liquid crystal layer, a vertical alignment (VA) liquid crystal layer, or a liquid crystal layer in another form.

The inspection method is elaborated hereinafter, given that the medium layer 120A is an LC layer, and the medium layer 120B is an electrochromic layer or a voltage sensitive dye, for instance.

Figure 6A:
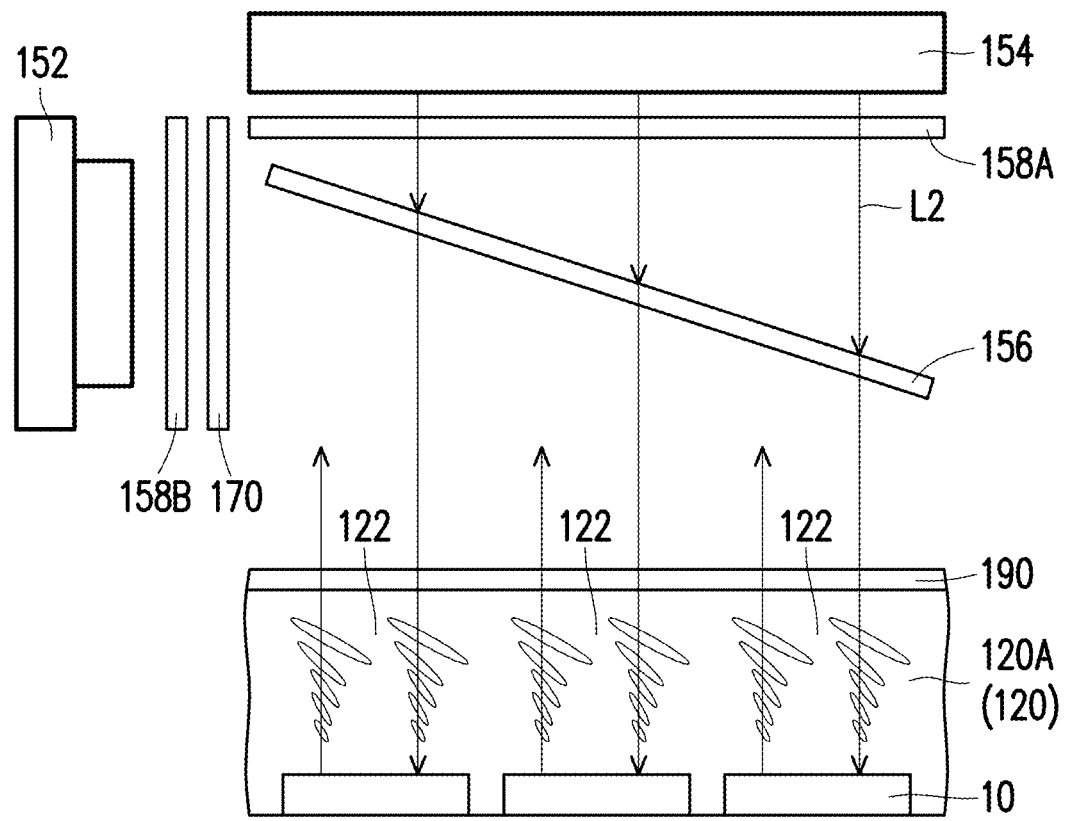
FIG. 6A is a schematic view of a plurality of light-emitting diodes (LEDs) 10, a medium layer 120A, and an optical image capturing portion 150 according to an embodiment of the disclosure.
Figure 6B:
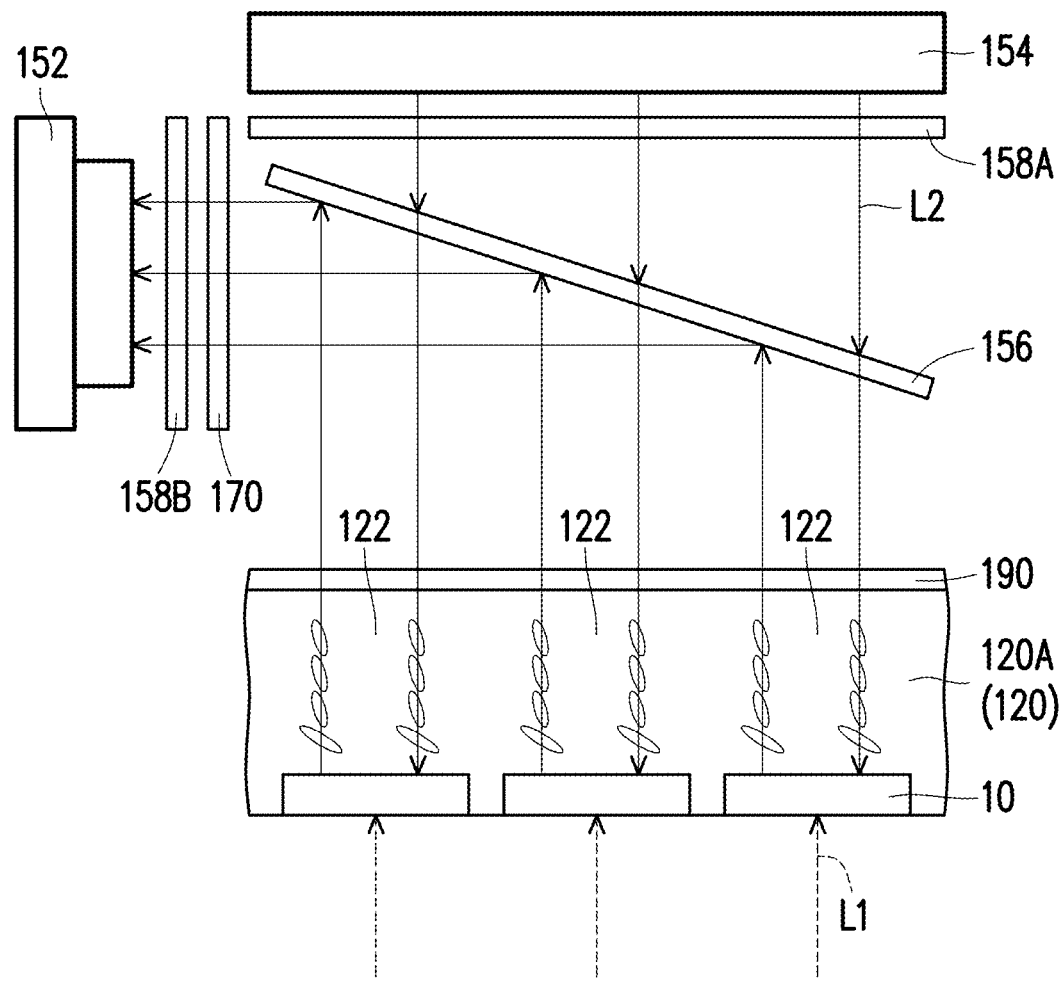
FIG. 6B is a schematic view of a plurality of LEDs 10, a medium layer 120A, and an optical image capturing portion 150 according to an embodiment of the disclosure.

FIG. 6A and FIG. 6B are schematic views of the LEDs 10, the medium layer 120A, and the optical image capturing portion 150 according to an embodiment of the disclosure, wherein the LEDs 10 depicted in FIG. 6A are not irradiated by the illumination beam L1, and the LEDs 10 depicted in FIG. 6B are irradiated by the illumination beam L1.

With reference to FIG. 6A and FIG. 6B, in the present embodiment, the medium layer 120A is a liquid crystal layer (including but not limited to twisted nematic liquid crystal). The optical image capturing portion 150 not only includes the optical-electro sensor 152 and an imaging lens but also selectively includes an image capturing light source 154, a first polarizing devices 158A and a second polarizing device 158B. The image capturing light source 154 is configured to emit the image capturing beam L2. The first polarizing device 158A is used to control the polarization direction of the image capturing light beam L2 emitting by the image capturing light source 154, and the second polarizing device 158B is used to control the polarization direction of the image capturing light beam L2 accepted by the optical-electro sensor 152. A transmission axis of the first polarizing devices 158A and a transmission axis of the second polarizing devices 158B are perpendicular to each other. The first polarizing device 158A is disposed on the medium layer 120A. The medium layer 120A is located between the first polarizing device 158A and the LEDs 10.

After the LEDs 10 are irradiated by the illumination beam L1, due to the photovoltaic effect, charges are accumulated on the electrodes of the LEDs 10 (not shown in FIG. 6A and FIG. 6B), thus inducing the electric field (not shown in FIG. 6A and FIG. 6B) and allowing liquid crystal molecules in the liquid crystal layer (i.e., the medium layer 120A) to reorient. The image capturing light source 154 emits the image capturing beam L2. The image capturing beam L2 passes through the first polarizing device 158A in front of the image capturing light source 154, above the medium layer 120A and is polarized. The polarized image capturing beam L2 sequentially passes through the liquid crystal layer (i.e., the medium layer 120A), is reflected by the LEDs 10 or other components (e.g., an upper electrode), and is transmitted to the second polarizing device 158B. The first polarizing device 158A and the second polarizing device 158B can be crossed. Their transmission axes are oriented perpendicular to each other. An alignment layer 190 is dispose beside the liquid crystal layer, and there is a specific angle between the transmission axis of the first polarizing device 158A and an rubbing direction of the alignment layer 190. For example the specific angle may be 45 degree. If the optical image capturing portion 150 can be response to the illumination beam L1, in order to enhance the quality of the optical image, the image capturing beam L2 will pass through a long pass filter 170 before accepting by the optical image capturing portion 150. The long pass filter 170 is disposed in a transmission path of the image capturing beam L2 between the medium layer 120 and the optical-electro sensor 152. For example, in this embodiment, the long pass filter 170 may be disposed between the optical-electro sensor 152 and the beam splitter 156, which is not limited in the disclosure. In another embodiment, the long pass filter 170 may be disposed between the beam splitter 156 and the medium layer 120. Due to the manufacturing variations, the electro-optical characteristics of the LEDs 10 are different; at this time, the electric fields generated by the LEDs 10 irradiated by the illumination beam L1 with the same intensity are different, so that the liquid crystal molecules in the inspection regions 122 of the medium layer 120A are reoriented in different levels. That is, the phases of the image capturing beam L2 changed by the inspection regions 122 of the medium layer 120A are different. Hence, when the image capturing beam L2 is again transmitted to the second polarizing device 158B, the intensity distribution of image capturing beam L2 passing through the second polarizing device 158B may be changed. Thereby, the brightness distribution of the image of the inspection regions 122 obtained by the optical-electro sensor 152 may be different, so as to deduce the difference in the electro-optical characteristics of the LEDs 10 from the image; alternatively, whether the LEDs 10 are functional and operated normally can be deduced from the image of the inspection regions 122 obtained by the optical-electro sensor 152.

In the present embodiment, the image capturing beam L2 may irradiate the medium layer 120A from the top of the LEDs 10, and the optical image capturing portion 150 may selectively include a beam splitter 156. The beam splitter 156 is disposed between the image capturing light source 154 and the first polarizing device 158A. The beam splitter 156 can reflect the image capturing beam L2 passing through the medium layer 120A and then passing through the second polarizing device 158B, and the optical-electro sensor 152 can be disposed on the upper-left side or the upper-right side of the LEDs 10, so as to receive the image capturing beam L2. This should however not be construed as a limitation in the disclosure; according to other embodiments, the image capturing beam L2 may also irradiate the medium layer 120A from the side of the LEDs 10, and the optical-electro sensor 152 can also be disposed above the LEDs 10.

Figure 7A:
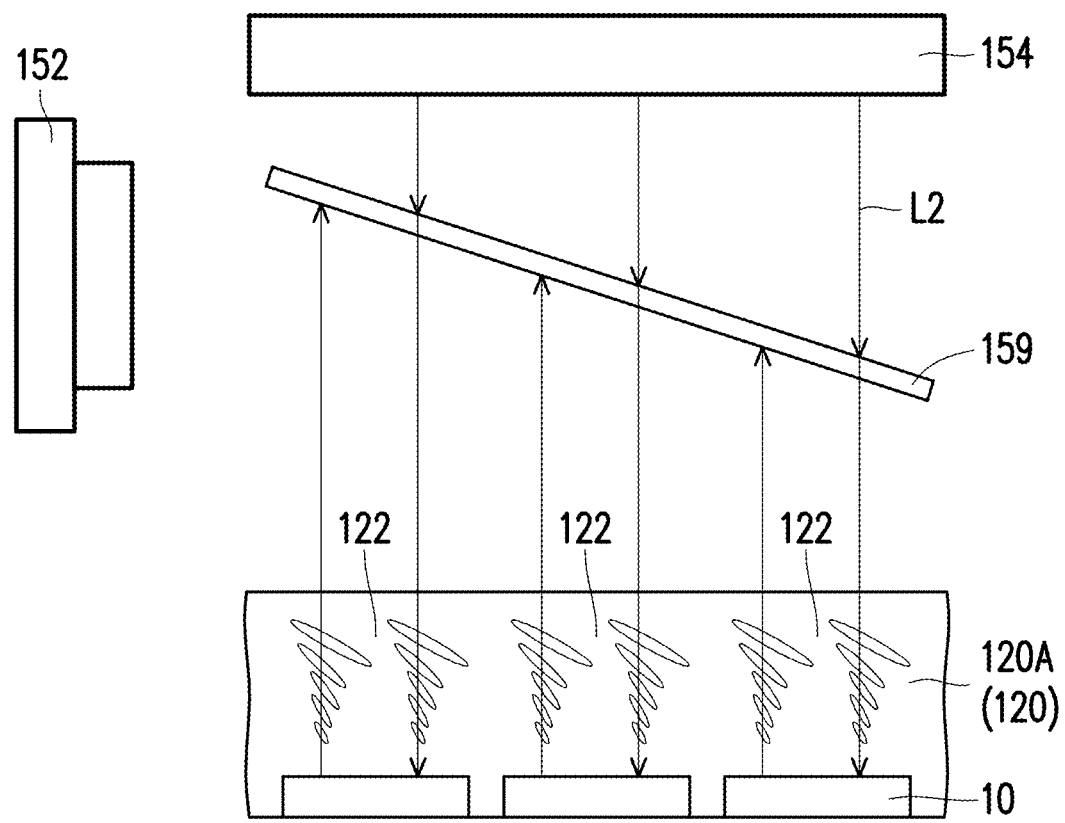
FIG. 7A is a schematic view of a plurality of LEDs 10, a medium layer 120A, and an optical image capturing portion 150 according to another embodiment of the disclosure.
Figure 7B:
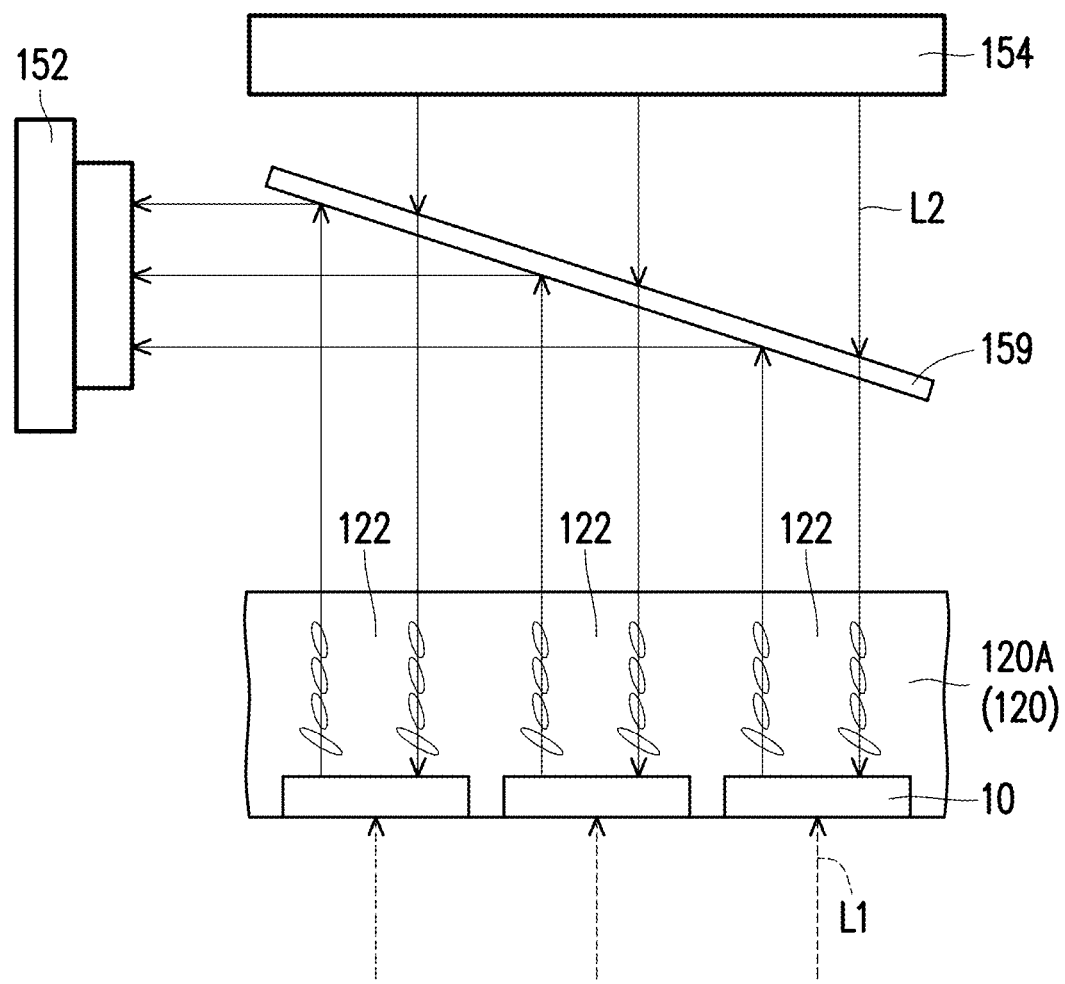
FIG. 7B is a schematic view of a plurality of LEDs 10, a medium layer 120A, and an optical image capturing portion 150 according to another embodiment of the disclosure.

FIG. 7A and FIG. 7B are schematic views of the LEDs 10, the medium layer 120A, and the optical image capturing portion 150 according to another embodiment of the disclosure, wherein the LEDs 10 depicted in FIG. 7A are not irradiated by the illumination beam L1, and the LEDs 10 depicted in FIG. 7B are irradiated by the illumination beam L1. The difference between the embodiment depicted in FIG. 7A and FIG. 7B and the embodiment depicted in FIG. 6A and FIG. 6B is in that the optical image capturing portion 150 depicted in FIG. 7A and FIG. 7B includes a polarizing beam splitter 159 which can replace the beam splitter 156, the first polarizing device 158A and the second polarizing device 158B depicted in FIG. 6A and FIG. 6B.

With reference to FIG. 7A and FIG. 7B, specifically, after the LEDs 10 are irradiated by the illumination beam L1, due to the photovoltaic effect, charges are accumulated on the electrodes of the LEDs 10 (not shown in FIG. 7A and FIG. 7B), thus inducing the electric field and allowing liquid crystal molecules of the liquid crystal layer (i.e., the medium layer 120A) to reorient. The image capturing light source 154 emits the image capturing beam L2. The image capturing beam L2 passes through the polarizing beam splitter 159 above the medium layer 120A and is polarized. The polarized image capturing beam L2 sequentially passes through the liquid crystal layer (i.e., the medium layer 120A), is reflected by the LEDs 10 or other components (e.g., an upper electrode), and is again reflected by the polarizing beam splitter 159. Then the polarized image capturing beam L2 is accepted by the optical image capturing portion 150. If the optical image capturing portion 150 can be response to the illumination beam L1, in order to enhance the quality of the image optical image, the image capturing beam L2 will pass through a long pass filter 170 (not shown in FIG. 7A and FIG. 7B) before accepting by the optical image capturing portion 150. Due to the manufacturing variations, the electro-optical characteristics of the LEDs 10 are different; at this time, the electric fields generated by the LEDs 10 irradiated by the illumination beam L1 with the same intensity are different, so that the liquid crystal molecules in the inspection regions 122 of the medium layer 120A are reoriented in different levels. That is, the phases of the image capturing beam L2 changed by the inspection regions 122 of the medium layer 120A are different. Hence, when the image capturing beam L2 is again reflected by the polarizing beam splitter 159, the intensity distribution of the image capturing beam L2 reflected by the polarizing beam splitter 159 may be changed. Thereby, the brightness distribution of the image of the inspection regions 122 obtained by the optical-electro sensor 152 may be different, so as to deduce the difference in the electro-optical characteristics of the LEDs 10 from the image; alternatively, whether the LEDs 10 are functional and operated normally can be deduced from the image of the inspection regions 122 obtained by the optical-electro sensor 152.

In the present embodiment, the polarizing beam splitter 159 can reflect the image capturing beam L2 passing through the medium layer 120A and again transmitted to the polarizing beam splitter 159, and the optical-electro sensor 152 can be disposed on the upper-left side or the upper-right side of the LEDs 10, so as to receive the image capturing beam L2 reflected by the polarizing beam splitter 159. This should however not be construed as a limitation in the disclosure; according to other embodiments, the image capturing beam L2 may also irradiate the medium layer 120A from the side of the LEDs 10, and the optical-electro sensor 152 can also be disposed above the LEDs 10.

Figure 8A:
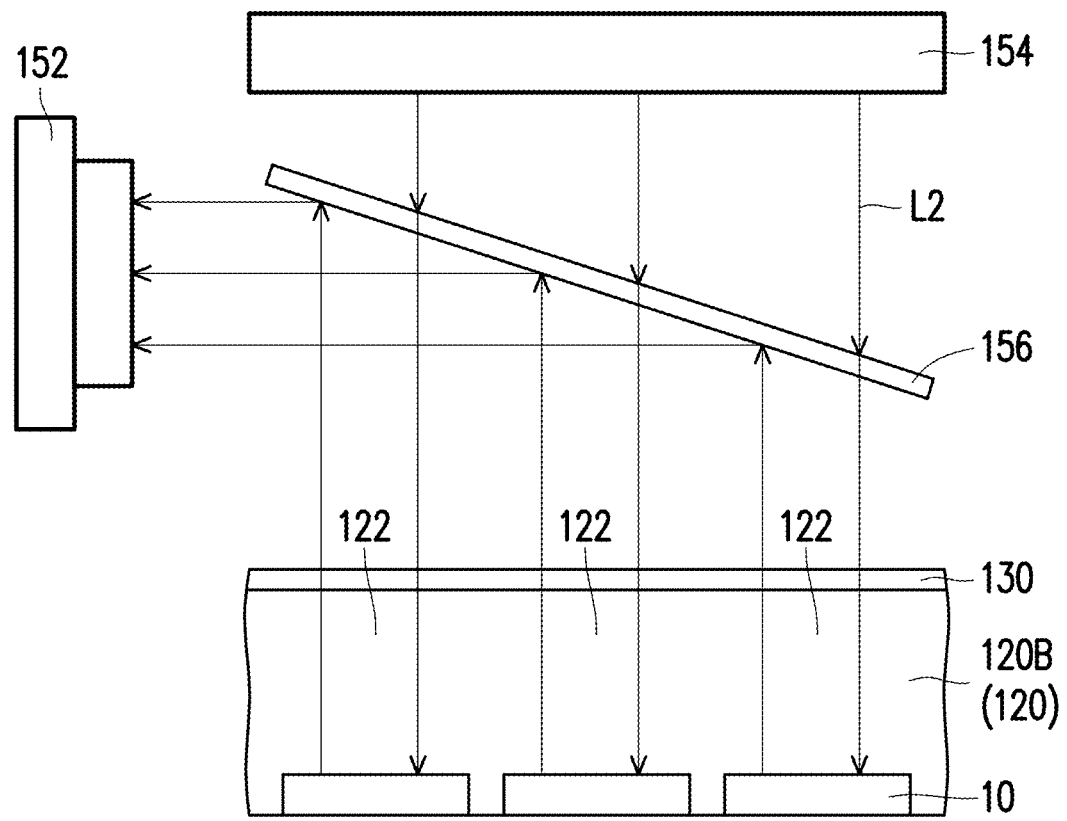
FIG. 8A is a schematic view of a plurality of LEDs 10, a medium layer 120A, and an optical image capturing portion 150 according to still another embodiment of the disclosure.
Figure 8B:
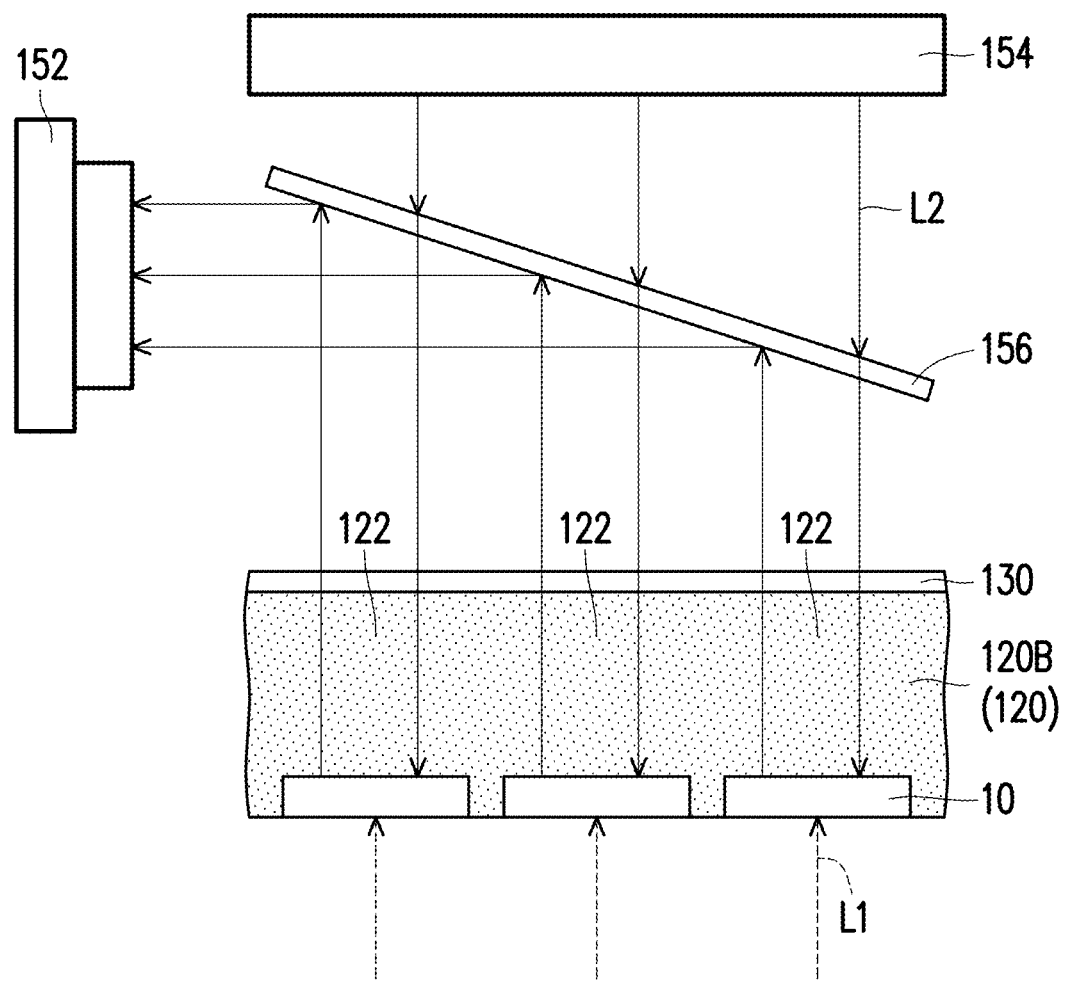
FIG. 8B is a schematic view of a plurality of LEDs 10, a medium layer 120A, and an optical image capturing portion 150 according to still another embodiment of the disclosure.

FIG. 8A and FIG. 8B are schematic views of the LEDs 10, the medium layer 120B, and the optical image capturing portion 150 according to still another embodiment of the disclosure, wherein the LEDs 10 depicted in FIG. 8A are not irradiated by the illumination beam L1, and the LEDs 10 depicted in FIG. 8B are irradiated by the illumination beam L1. The difference between the embodiment depicted in FIG. 8A and FIG. 8B and the embodiment depicted in FIG. 6A and FIG. 6B is in that the medium layer 120B shown in FIG. 8A and FIG. 8B is an electrochromic (EC) layer or a voltage sensitive dye, while the optical image capturing portion 150 depicted in FIG. 8A and FIG. 8B may also include the image capturing light source 154 but may not include the first polarizing device 158A and the second polarizing device 158B.

With reference to FIG. 8A and FIG. 8B, after the LEDs 10 are irradiated by the illumination beam L1, due to the photovoltaic effect, charges are accumulated on the electrodes of the LEDs 10 (not shown in FIG. 8A and FIG. 8B), thus inducing the electric field (not shown in FIG. 8A and FIG. 8B) or the voltage, which results in the color change of the EC layer or the voltage sensitive dye (i.e., the medium layer 120B). The image capturing light source 154 emits the image capturing beam L2, so that the optical-electro sensor 152 is allowed to read the color change of the EC layer or the voltage sensitive dye (i.e., the medium layer 120B). Due to the manufacturing variations, the electro-optical characteristics of the LEDs 10 are different; at this time, the electric fields generated by the LEDs 10 irradiated by the illumination beam L1 with the same intensity are different, so that the color changes in the inspection regions 122 of the medium layer 120B are in different degrees. The difference in the electro-optical characteristics of the LEDs 10 and whether the LEDs 10 normally function and do not fail can be deduced from the color distribution of the light obtained through the optical-electro sensor 152, or the LEDs 10 can be classified according to the color distribution of the light obtained through the optical-electro sensor 152. If the optical image capturing portion 150 can be response to the illumination beam L1, in order to enhance the quality of the optical image, the image capturing beam L2 will pass through a long pass filter 170 (not shown in FIG. 8A and FIG. 8B) before accepting by the optical image capturing portion 150. In the present embodiment, the optical image capturing portion 150 not only can be a camera but also can be a color analyzer or an image spectrum reading probe that is able to directly read a color coordinate (or a light spectrum).

Figure 9:
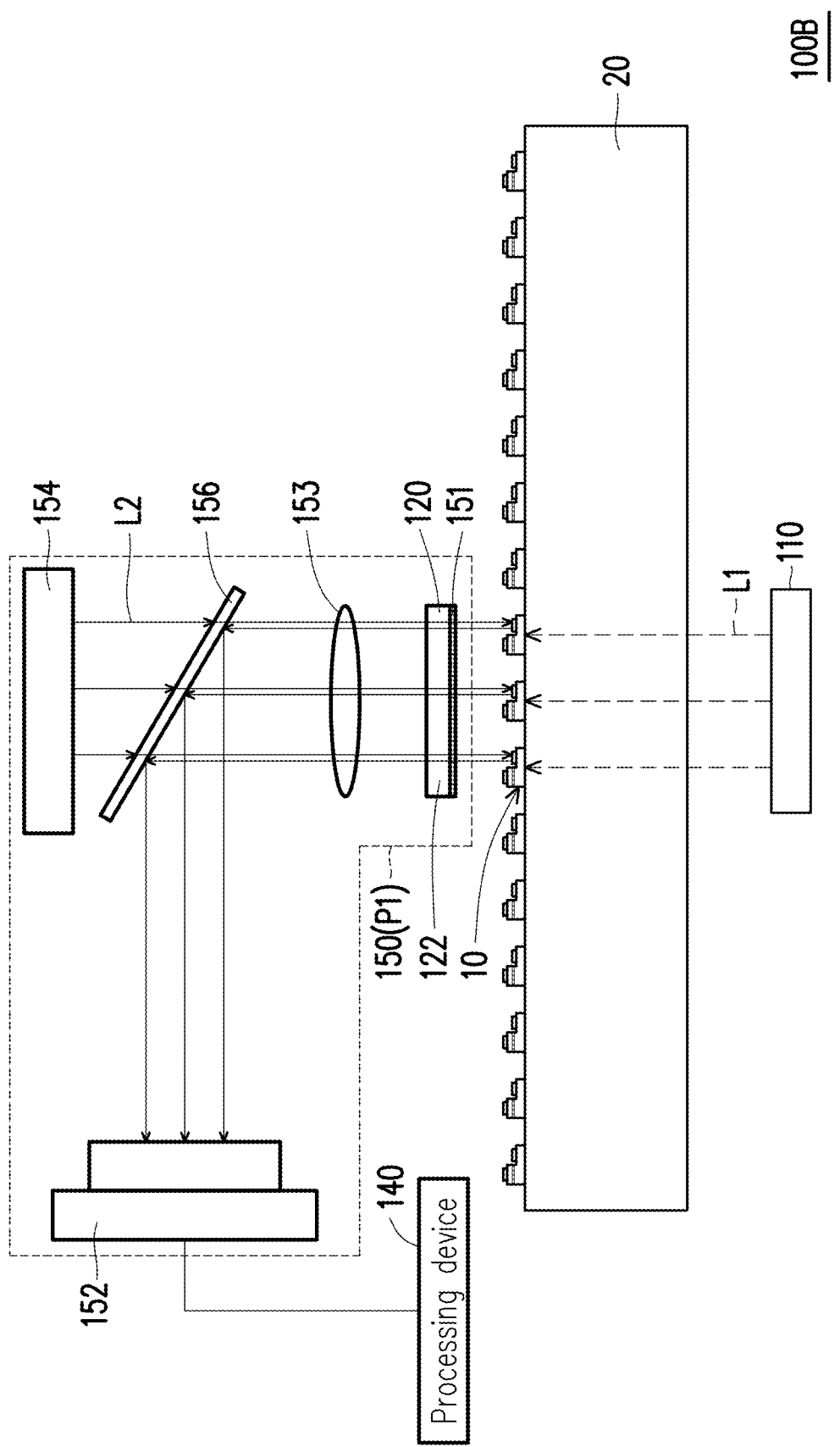
FIG. 9 is a schematic view of an inspection apparatus 100B according to still another embodiment of the disclosure.

FIG. 9 is a schematic view of an inspection apparatus 100B according to another embodiment of the disclosure. The inspection apparatus 100B is similar to the aforesaid inspection apparatus 100, while the difference therebetween is in that the medium layer 120 and the optical image capturing portion 150 can be integrated to form a sensing probe P1 according to the embodiment shown in FIG. 9.

While the LEDs 10 are being inspected, the medium layer 120 of the sensing probe P1 may be arranged to be very close to the LEDs 10 (i.e., the medium layer 120 is disposed above the LEDs 10, wherein the medium layer 120 is separated from the LEDs 10), or the medium layer 120 of the sensing probe P1 is arranged to touch the LEDs 10. The sensing probe P1 can alternatively include the reflective layer 151 disposed below the medium layer 120. The reflectance of the reflective layer 151 is high. The reflectance is preferably larger than 90% or 99%. The reflective layer 151 can reflect the image capturing beam L2 (passing through the medium layer 120) to the optical-electro sensor 152. The sensing probe P1 can alternatively include the transmitted layer (not shown FIG. 9) disposed below the medium layer 120 to replace the reflective layer 151. The transmittance of the transmitted layer is high. For example, the transmittance of the transmitted layer is preferably larger than 90% or 99%. The image capturing beam L2 can pass through medium layer 120 and the transmitted layer, be reflected by the electrodes of the LEDs 10 and arrive at the optical-electro sensor 152 in sequence. Moreover, the sensing probe P1 may further include a lens 153 disposed above the medium layer 120, which should however not be construed as a limitation in the disclosure.

Figure 10:
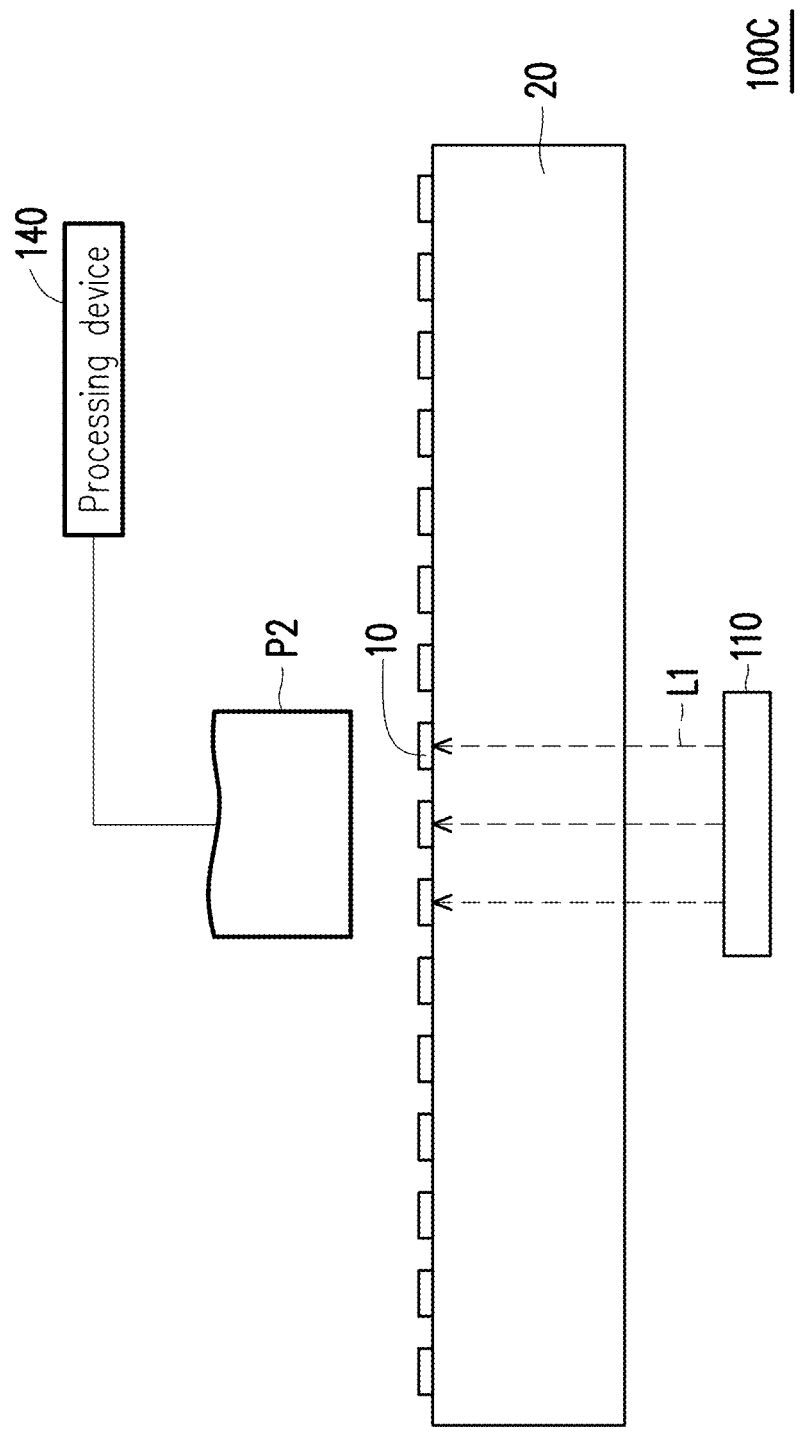
FIG. 10 is a schematic view of an inspection apparatus 100C according to still another embodiment of the disclosure.

FIG. 10 is a schematic view of an inspection apparatus 100C according to another embodiment of the disclosure. The inspection apparatus 100C is similar to the inspection apparatus 100 described above, and the difference therebetween lies in that the inspection apparatus 100C depicted in FIG. 10 may include a sensing probe P2 configured to measure a charge distribution, an electric field distribution, or a voltage distribution on the LEDs 10 simultaneously irradiated by the illumination beam L1. For instance, if the LEDs 10 may be vertical LEDs or horizontal LEDs, the sensing probe P2 may be a charge probe or an electric field or voltage measuring probe. Since the LEDs 10 described below are arranged in an array, the sensing probe P2 may be composed of a number of small charge probes or small electric field or voltage measuring probes. The inspection apparatus 100C need not include the medium layer 120 and the optical image capturing portion 150.

Note that the medium layer 120, 120A, or 120B described in some of the previous embodiments (e.g., the embodiments depicted in FIG. 1, FIG. 4, FIG. 6A, FIG. 7A, and FIG. 8A) is directly disposed on the LEDs 10. However, for easy inspection, the medium layer 120 or 120A described in some of the previous embodiments can be integrated into the sensing probe, which is exemplified in FIG. 11.

Figure 11:
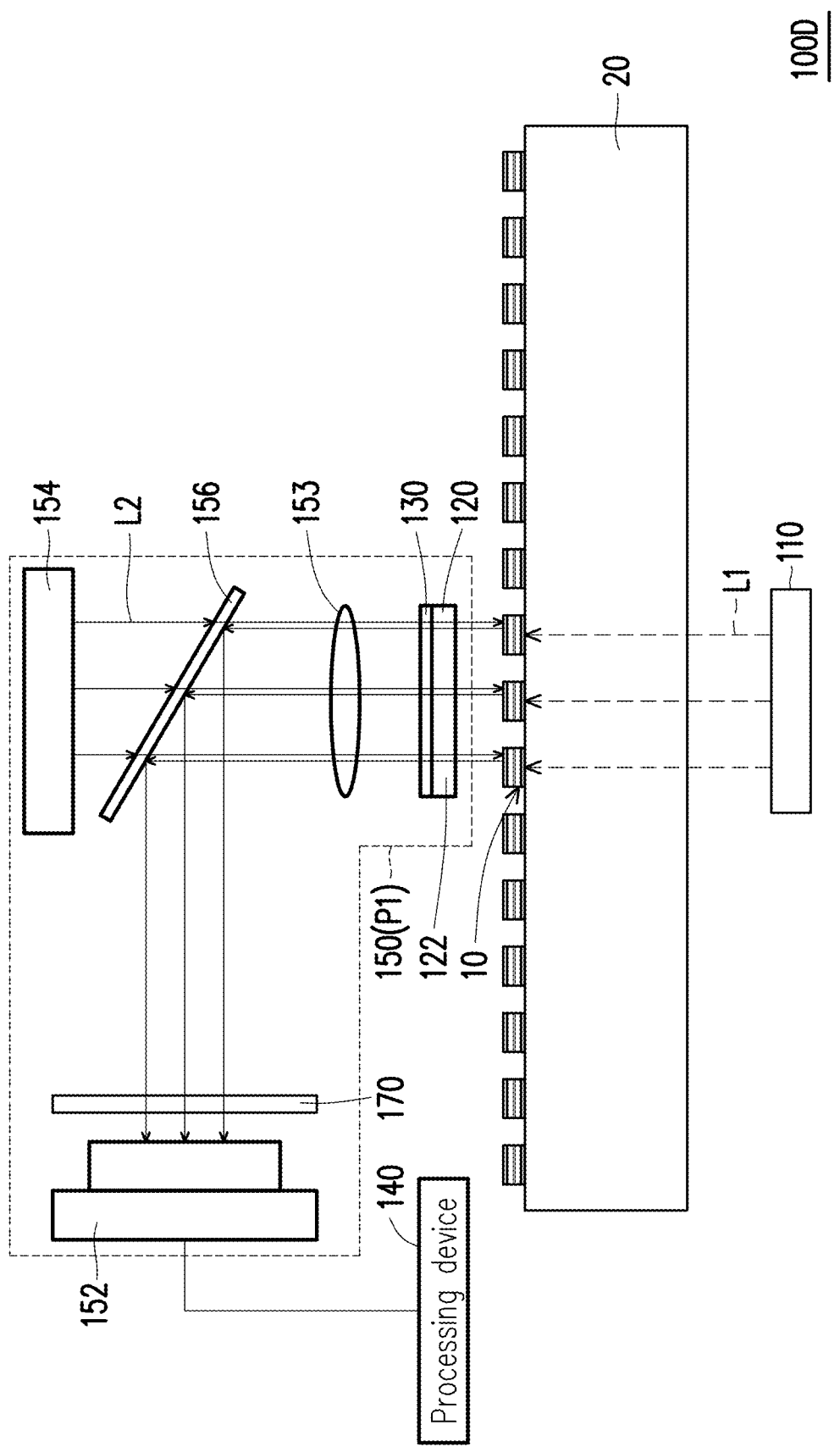
FIG. 11 is a schematic view of an inspection apparatus 100D according to an embodiment of the disclosure.

FIG. 11 is a schematic view of an inspection apparatus 100D according to an embodiment of the disclosure. The inspection apparatus 100D depicted in FIG. 11 is similar to the inspection apparatus 100A depicted in FIG. 4, while the main difference therebetween is in that the inspection apparatus 100D depicted in FIG. 11 can also integrate the medium layer 120 into the sensing probe P1, while the other components in the sensing probe P1 of the inspection apparatus 100D have been described in the previous paragraphs and thus will not be further explained. Moreover, the inspection apparatus 100D may selectively include a long pass filter 170. In this embodiment, the long pass filter 170 may be disposed between the optical-electro sensor 152 and the beam splitter 156, which is not limited in the disclosure. In another embodiment, the long pass filter 170 may be disposed between the beam splitter 156 and the medium layer 120.

In the embodiment of inspecting the horizontal LEDs (e.g., the embodiments depicted in FIG. 4 and FIG. 9), note that two upper surfaces of the electrodes 13a and 13b of each of the horizontal LEDs 10 are not coplanar. This should however not be construed as a limitation in the disclosure; the horizontal LEDs 10 can be inspected no matter whether the two upper surfaces of the electrodes 13a and 13b of each of the horizontal LEDs 10 are coplanar, which will be exemplarily explained below with reference to FIG. 12.

Figure 12:
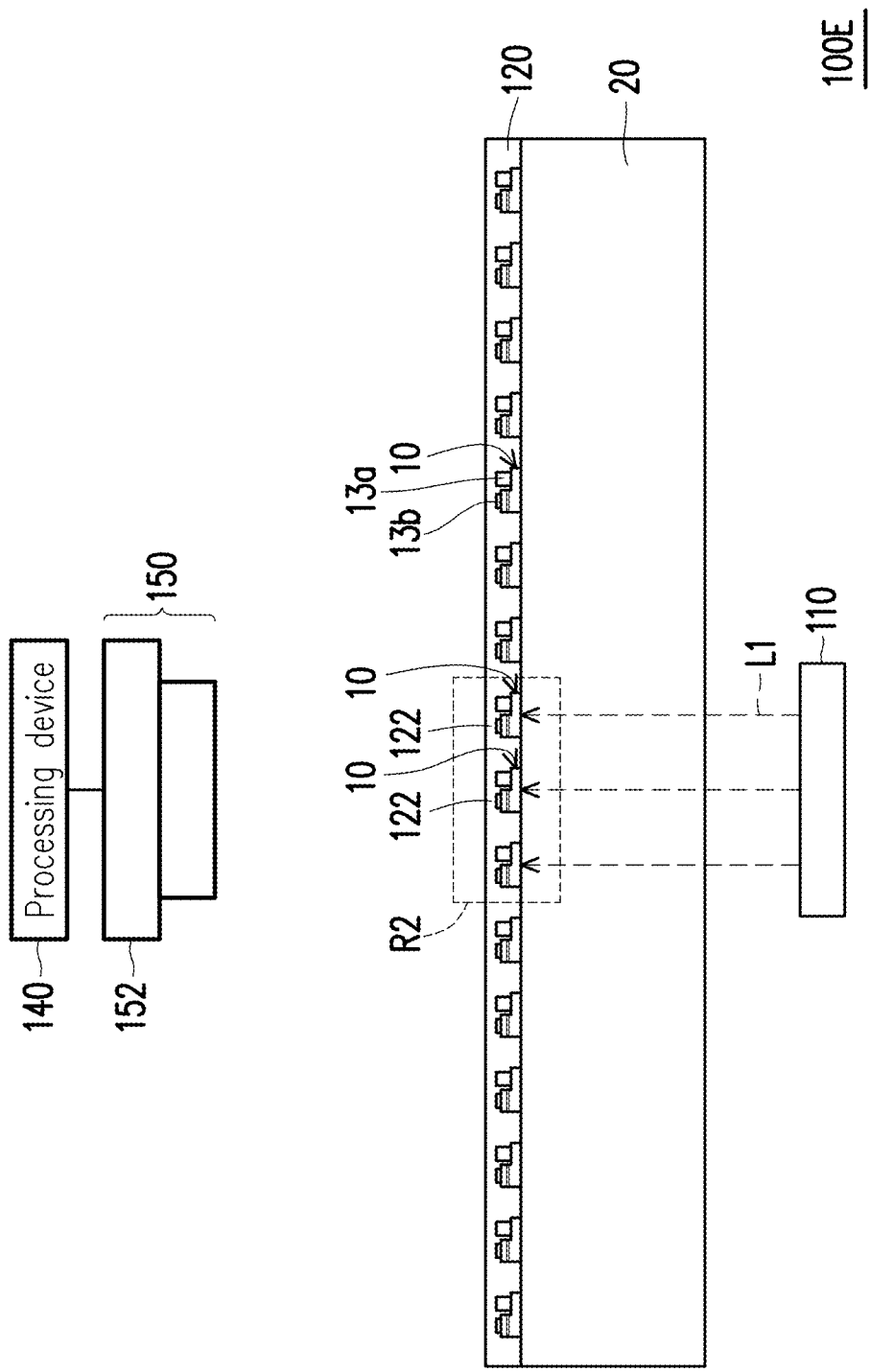
FIG. 12 is a schematic view of an inspection apparatus 100E according to another embodiment of the disclosure.

FIG. 12 is a schematic view of an inspection apparatus 100E according to another embodiment of the disclosure. The inspection apparatus 100E depicted in FIG. 12 is similar to the inspection apparatus 100A depicted in FIG. 4, while the main difference therebetween is in that the two upper surfaces of the electrodes 13a and 13b of each of the LEDs 10 inspected by the inspection apparatus 100E shown in FIG. 12 can be coplanar.

Figure 13:
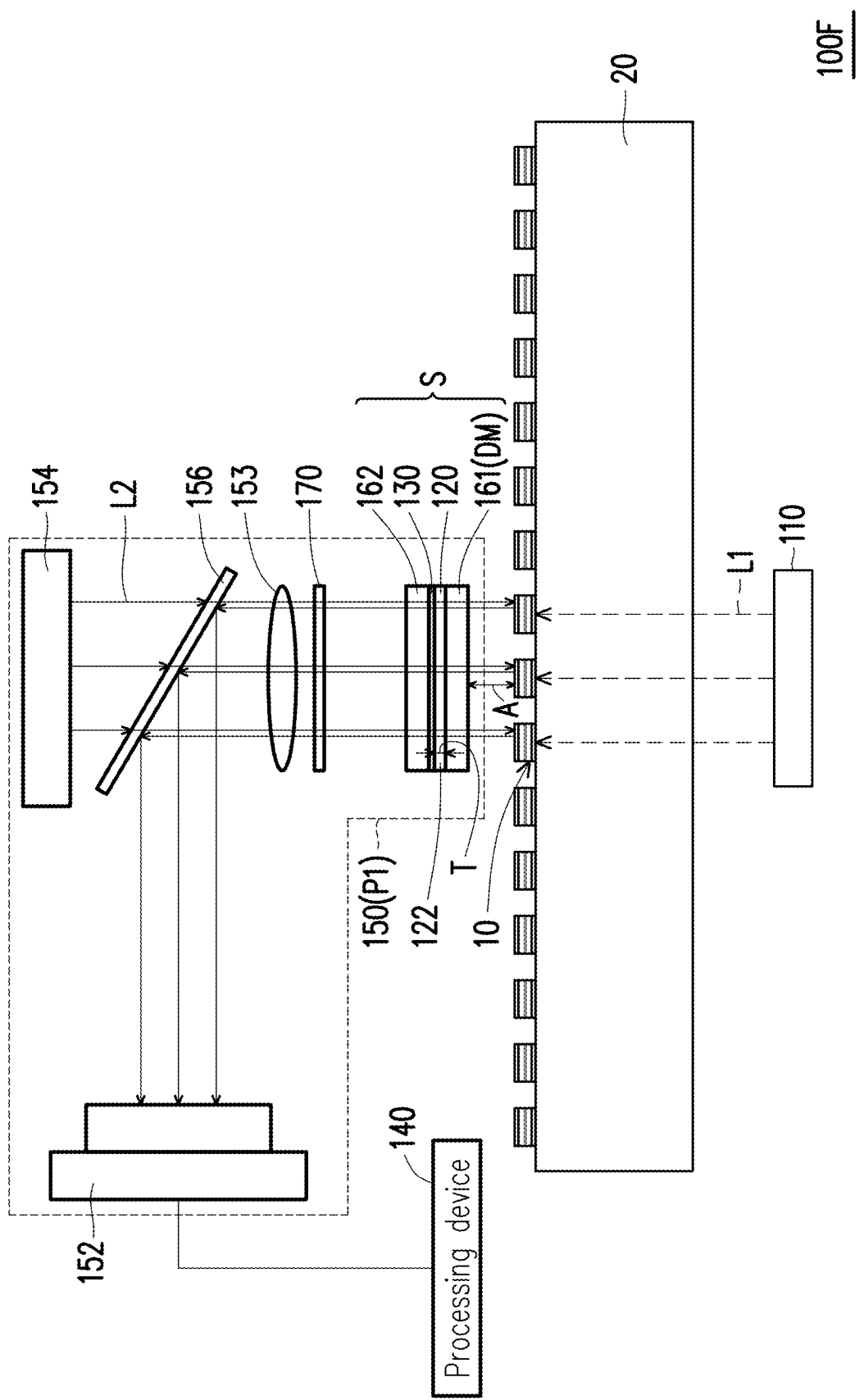
FIG. 13 is a schematic view of an inspection apparatus 100F according to an embodiment of the disclosure.

FIG. 13 is a schematic view of an inspection apparatus 100F according to an embodiment of the disclosure. The inspection apparatus 100F of FIG. 13 is similar to the inspection apparatus 100D of FIG. 11. The following describes the differences between the inspection apparatus 100F of FIG. 13 and the inspection apparatus 100D of FIG. 11.

Referring to FIG. 13, in this embodiment, the illumination beam L1 has sufficient light intensity. When the illumination light beam L1 with sufficient light intensity simultaneously illuminates a plurality of light-emitting diodes 10, a charge distribution close to a saturation charge distribution, an electric field distribution close to a saturation electric field distribution or a saturation voltage distribution close to a saturation voltage distribution on the plurality of light-emitting diodes 10.

Figure 14:
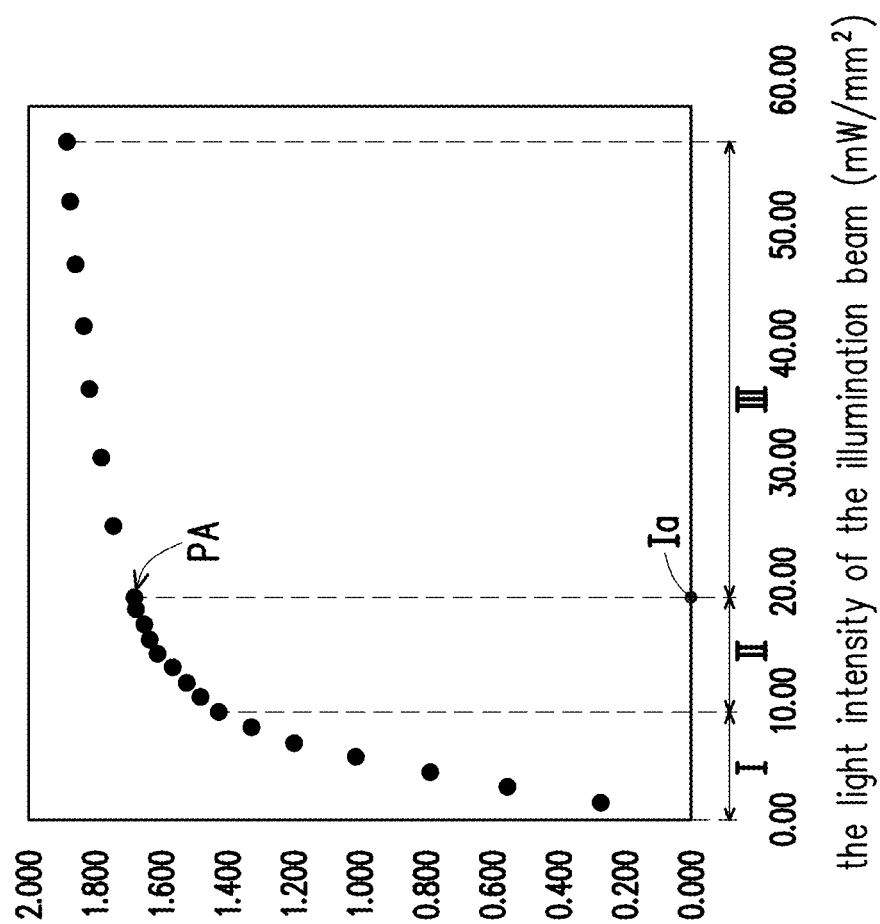
FIG. 14 is a relationship between a light intensity of an illumination beam L1 and a voltage on the light-emitting diode 10 according to an embodiment of the disclosure.

FIG. 14 shows a relationship between a light intensity of an illumination beam L1 and a voltage on the light-emitting diode 10 according to an embodiment of the disclosure, wherein the voltage on the light-emitting diode 10 is generated due to the photovoltaic effect caused by the illumination beam L1.

In the experimental process of obtaining FIG. 14, the light intensity of the illumination light beam L1 can be gradually increased, and voltages on the two electrodes 13a, 13b (depicted in FIG. 2) of the light-emitting diode 10 irradiated by the illumination beams with various light intensities are recorded, so as to obtain the relationship between the light intensity of the illumination beam L1 and the voltage on the light-emitting diode 10.

As shown in FIG. 14, in the beginning of the curve, the region I, voltage on the two electrodes 13a, 13b of the light-emitting diode 10 increases efficiently with the intensity of the illumination beam L1, and the voltage on the two electrodes 13a, 13b of the light-emitting diode 10 and the light intensity of the illumination beam L1 have a linear relationship with the largest slope in the curve. In the region II, a slope of a point in this region change from the larger one to the smaller one with the increasing of the intensity of the illumination beam. In the region III, voltage on the two electrodes 13a, 13b of the light-emitting diode 10 changes very slowly with the intensity of the illumination beam L1, and a slope of one point (i.e. the last point) in the region III is the smallest one in the whole curve. The slope of the one point (i.e. the last point) in the region III is close to a saturation value (i.e. 0). One point of the curve on a junction of the region II and the region III is called a turning point PA. The turning point PA of the curve changes from a large derivative of the curve to a smallest derivative. The light intensity of the turning point PA is Ia. The illumination light beam L1 whose light intensity is greater than Ia or equal to Ia is the above-mentioned illumination light beam L1 having sufficient light intensity. The preferred sufficient light intensity may be ≥5*Ia.

Referring to FIG. 13, in the condition where the illumination light beam L1 with sufficient light intensity simultaneously illuminates the plurality of light-emitting diodes 10, the sensing probe P1 measures the charge distribution close to the saturation charge distribution, the electric field distribution close to the saturation electric field distribution or the voltage distribution close to the saturation voltage distribution. The processing device 140 can determine luminous energies of the plurality of light-emitting diodes 10 operated under constant currents according the charge distribution close to the saturation charge distribution, the electric field distribution close to the saturation electric field distribution or the voltage distribution close to the saturation voltage distribution on the plurality of light-emitting diodes 10 measured by the sensing probe P1.

A following table. 1 shows correlation coefficients C between various voltages Voc-100% Voc-40% and Voc-10% generated by the light-emitting diode 10 due to the photovoltaic effect induced by the illumination light beam L1 with different light intensity I and luminous energies of the light-emitting diode 10 operated under various constant currents (i.e. 10 μA, 50 μA, 200 μA and 300 μA). The voltage Voc-100% is a voltage due to the photovoltaic effect when the light-emitting diode 10 is irradiated by the illumination light beam L1 with 100% of our available illumination light beam. The voltage Voc-40% is a voltage due to the photovoltaic effect when the light-emitting diode 10 is irradiated by the illumination light beam L1 with 40% of our available illumination light beam. The voltage Voc-10% is a voltage due to the photovoltaic effect when the light-emitting diode 10 is irradiated by the illumination light beam L1 with 10% of our available illumination light beam A light intensity of our available illumination light beam is equal to or greater than the light intensity Ia of the turning point PA.

Figure 15:
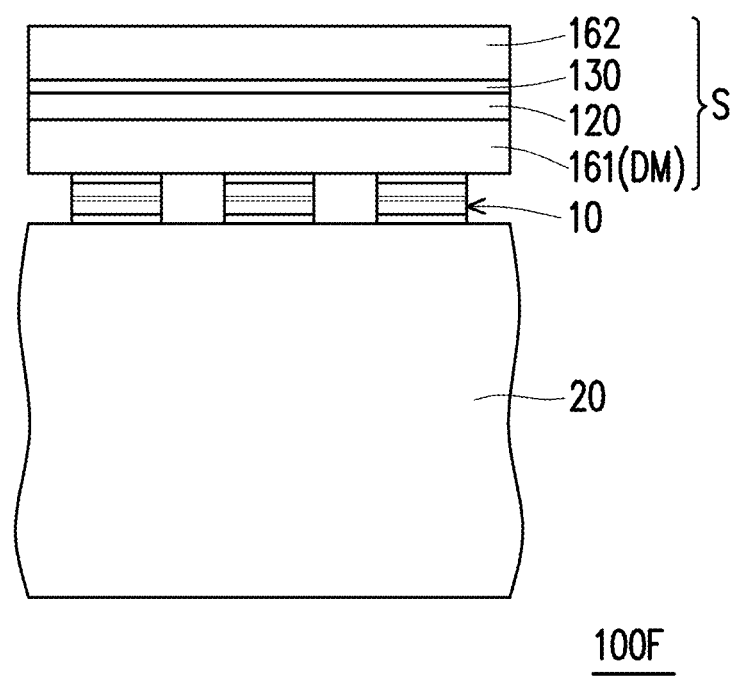
FIG. 15 is a partially enlarged schematic view of an inspection apparatus 100F according to an embodiment of the disclosure.

FIG. 15 is a partially enlarged schematic view of an inspection apparatus 100F according to an embodiment of the disclosure.

Referring to FIG. 13 and FIG. 15, in this embodiment, the medium layer 120 and the conductive layer 130 may be sandwiched between the first substrate 161 and the second substrate 162. The medium layer 120 is disposed between the conductive layer 130 and the first substrate 161. The conductive layer 130 is disposed between the second substrate 162 and the medium layer 120. The first substrate 161, the medium layer 120, the conductive layer 130 and the second substrate 162 constitute a photoelectric sensing structure S. When the inspection apparatus 100F uses the photoelectric sensing structure S of the sensing probe P1 to inspect the plurality of light-emitting diodes 10, the first substrate 161 is closer to the plurality of light-emitting diodes 10 than the second substrate 162.

In this embodiment, when the inspection apparatus 100F inspects the plurality of light-emitting diodes 10, the first substrate 161 of the photoelectric sensing structure S can be used as a dielectric material DM between the medium layer 120 and the plurality of light-emitting diodes 10. Furthermore, we may deposit a liquid with a high dielectric constant between the first substrate 161 and the plurality of light-emitting diodes 10, or it is on the plurality of light-emitting diodes 10. For example, the dielectric constant of the dielectric material DM and the liquid is larger than that of the air. A relative permittivity of the dielectric material DM and the liquid may be larger than 30. The relative permittivity of the dielectric material DM and the liquid is preferably larger than 100 or 1000. So that the large ratio of the saturation charge distribution close to the saturation charge distribution, the large ratio of the electric field distribution close to the saturation electric field distribution or the large ratio of the voltage distribution close to the saturation voltage distribution on the plurality of light-emitting diodes 10 can be efficiently sensed by the medium layer 120. For

TABLE 1

| | | voltages generated by the light-emitting diode 10 due to the photovoltaic effect by the illumination light beam L1 with different light intensity I | | |
|---|---|---|---|---|
| | | Voc-100% | Voc-40% | Voc-10% |
| luminous energies of the light-emitting diode 10 operated under various constant currents | constant current = 10 μA | C = 0.88 | C = 0.82 | C = 0.09 |
| | constant current = 50 μA | C = 0.85 | C = 0.82 | C = 0.13 |
| | constant current = 200 μA | C = 0.81 | C = 0.79 | C = 0.15 |
| | constant current = 300 μA | C = 0.77 | C = −0.11 | C = 0.13 |

From the experimental data in the above Table 1, it can be known that correlation coefficients C between the voltage Voc-100% and luminous energies of the light-emitting diode 10 operated under various constant currents (i.e. 10 μA, 50 μA, 200 μA and 300 μA) are high. In other words, the charge distribution close to the saturation charge distribution, the electric field distribution close to the saturation electric field distribution or the voltage distribution close to the saturation voltage distribution generated by the plurality of light-emitting diodes 10 irradiated by the illumination light beam L1 with sufficient light intensity I can accurately represent the electro-optical characteristics of the plurality of light-emitting diodes 10 (for example, luminous energies of the light-emitting diode 10 operated under various constant currents).

example, in this embodiment, the material of the first substrate 161 may be conjugated polymers, Calcium copper titanate, ferroelectric materials or ceramics, which is not limited in the disclosure. For example, in this embodiment, a liquid with a high dielectric constant may be deionization water, which is not limited in the disclosure.

In addition, in this embodiment, if the medium layer 120 is a liquid crystal layer, two alignment layers (not shown) may be disposed on two opposite sides of the medium layer 120, one of the two alignment layers may be disposed between the conductive layer 130 and the medium layer 120, and the other of the two alignment layers may be disposed between the conductive layer 130 and the first substrate 161. Alignment layers are used orientate the LC molecules with a specific pretilt angle.

Figure 16:
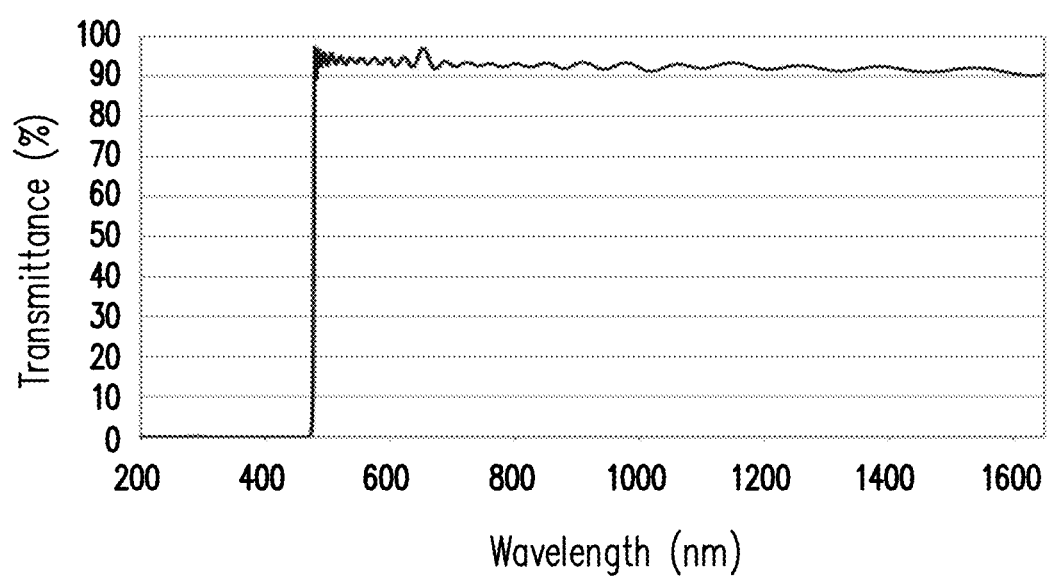
FIG. 16 is a transmittance spectrum of a long pass filter 170 according to an embodiment of the disclosure.

Referring to FIG. 13, in this embodiment, the sensing probe P1 may further include a long pass filter 170, disposed between the medium layer 120 and the optical-electro sensor 152. For example, in this embodiment, the long pass filter 170 may be disposed between the beam splitter 156 and the medium layer 120, which is not limited in the disclosure. In another embodiment, the long pass filter 170 may be disposed between the optical-electro sensor 152 and the beam splitter 156. FIG. 16 shows a transmittance spectrum of a long pass filter 170 according to an embodiment of the disclosure. Referring to FIG. 13 and FIG. 16, the long pass filter 170 is used to block at least one of the illumination light beam L1 and a light beam (not shown) generated by the plurality of light-emitting diodes 10 due to the photoluminescence effect, and the imaging beam L2 can pass through the long pass filter 170.

For example, in this embodiment, the center wavelength of the illumination light beam L1 may be less than 400 nm, and the light beam emitted by the plurality of light-emitting diodes 10 due to the photoluminescence effect caused by the illumination light beam L1 may be an ultraviolet light, and the long pass filter 170 having the transmittance spectrum shown in FIG. 16 can block the illumination light beam L1 and the light beam emitted by the plurality of light-emitting diodes 10 due to the photoluminescence effect caused by the illumination light beam L1. In addition, in this embodiment, the image capturing light source 154 emitting the image capturing beam L2 is a monochromatic light source. For example, the image capturing light source 154 is a monochromatic light-emitting diode light source. A wavelength range of the image capturing beam L2 emitted by the image capturing light source 154, a wavelength range of the illumination light beam L1 and a wavelength range of the light beam emitted by the plurality of light-emitting diodes 10 due to the photoluminescence effect are different. In accordance with the above requirements for the wavelength range of the image capturing beam L2, in order to increase the resolution of the image, the wavelength range of the image capturing beam L2 is preferably a short wavelength range, which is not limited in the disclosure.

Figure 17:
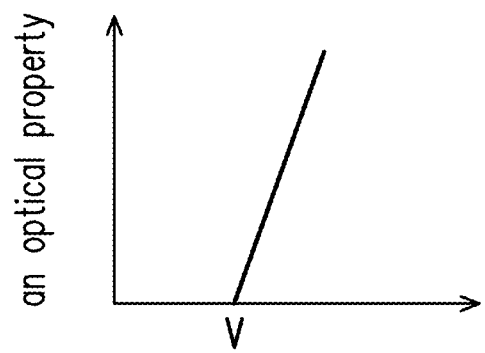
FIG. 17 is a relationship between a charge, an electric field or a voltage and an optical property of a medium layer induced by the charge, the electric field or the voltage.

FIG. 17 shows a relationship between the optical properties of a medium layer 120 and the variation of the charge, the electric field or the voltage across the media layer 120.

Figure 18:
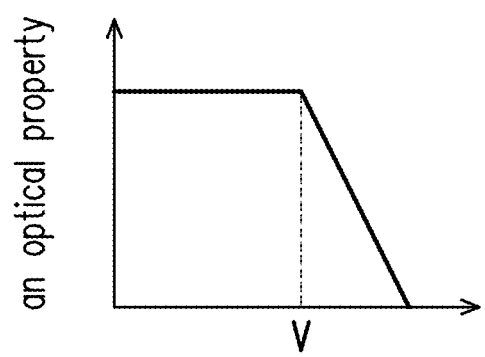
FIG. 18 is a relationship between a charge, an electric field or a voltage and an optical property of another medium layer induced by a charge, a electric field or a voltage.

FIG. 18 shows a relationship between the optical properties of a medium layer 120 and the variation of the charge, the electric field or the voltage across the media layer.

Referring to FIG. 13, FIG. 17 and FIG. 18, in this embodiment, the optical property change due to the effect of charge, the electric field or the voltage of the medium layer 120 may have a threshold value V. For example, the relationship between the charge, the electric field, or the voltage and the optical property change due to the effect of charge, the electric field or the voltage of the medium layer 120 may be the relationship shown in FIG. 17 or FIG. 18.

In this embodiment, the processing device 140 determines whether a light-emitting diode 10 corresponding to an inspection region 122 is normal according to whether the corresponding optical property change occurs in the inspection region 122 (i.e., whether the electric field, the charge, or the voltage caused by the light-emitting diode 10 exceeds the threshold value V).

Further, if the electric field, the charge or the voltage caused by the light-emitting diode 10 has exceeded the threshold value V and the inspection region 122 corresponding to the light-emitting diode 10 of the medium layer 120 has an optical property change. The processing device 140 can classify the light-emitting diode 10 according to an amount of the optical property change.

In this embodiment, the threshold V can be adjusted by changing at least one of the distance A between the light-emitting diode 10 and a photoelectric sensing structure S, the dielectric constant of an object disposed between the light-emitting diode 10 and photoelectric sensing structure S, the thickness of the first substrate 161 between the medium layer 120 and the light-emitting diode 10, the dielectric constant of the first substrate 161 between the medium layer 120 and the light-emitting diode 10, the thickness T of the medium layer 120 and the dielectric constant of the medium layer 120, which is not limited in the disclosure.

Furthermore, referring to FIG. 13, the inspection region 122 corresponding to the light-emitting diode 10 of the medium layer 120 has an optical property change. The processing device 140 can classify the light-emitting diode 10 in groups according to an amount of the optical property change based on the application requirements of the end products.

Figure 19:
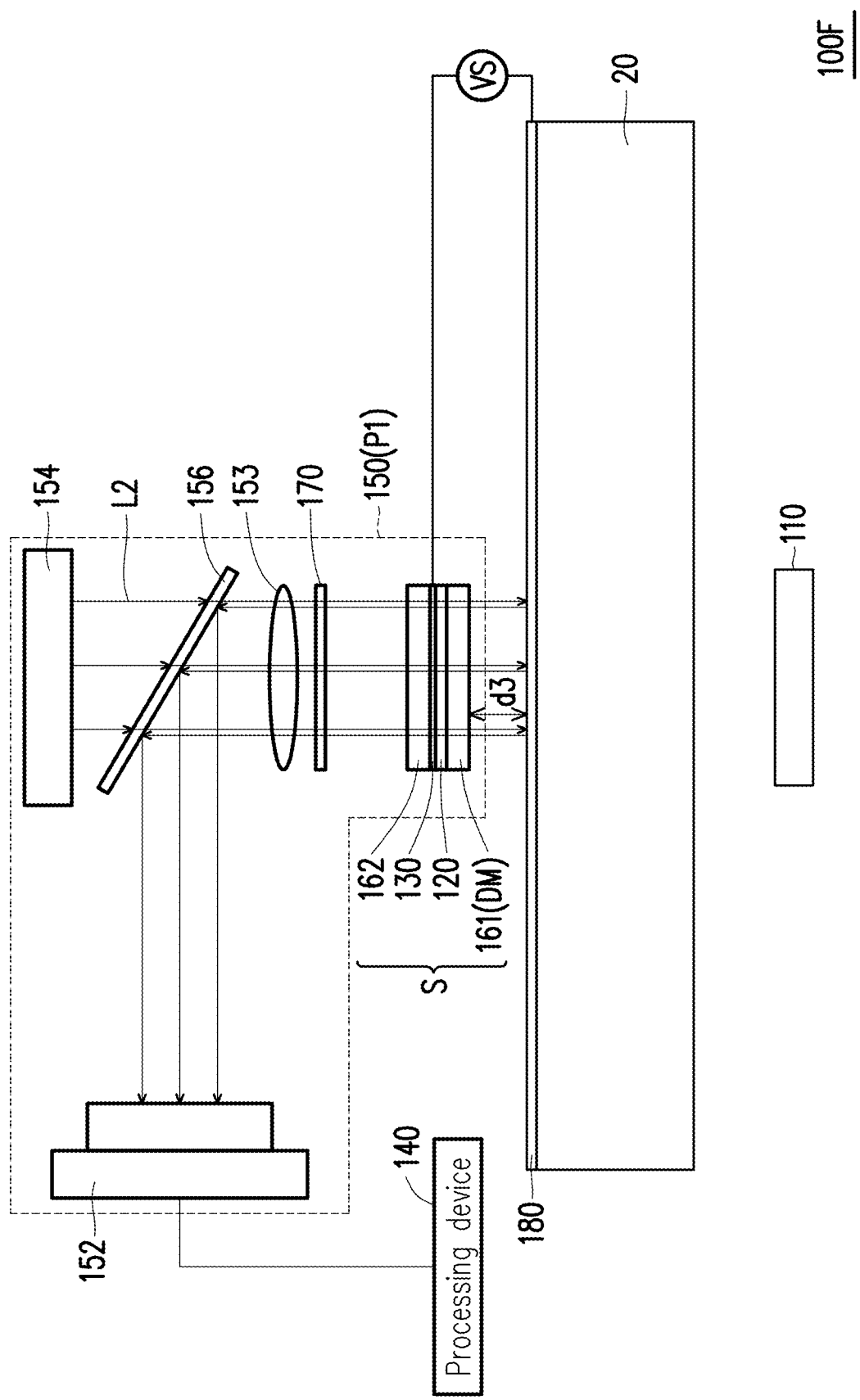
FIG. 19 is a calibration process of an inspection apparatus 100F according to an embodiment of the disclosure.

FIG. 19 shows a calibration process of an inspection apparatus 100F according to an embodiment of the disclosure. The inspection apparatus 100F can perform steps of a method for inspecting the light-emitting diodes 10.

Referring to FIG. 19, in this embodiment, the inspection apparatus 100F further includes a calibration sheet 180. The calibration sheet 180 and the sensing probe P1 keep a fixed distance d3, the calibration sheet 180 is used to generate a set of controllable correction charge distributions, a set of controllable correction electric field distributions, or a set of controllable correction voltage distributions. In the embodiment, the calibration sheet 180 and the sensing probe P1 keep a fixed distance d3, the sensing probe P1 measures the optical property changes of the medium layer 120 in the photoelectric sensing structure S under the controllable correction charge distributions, the controllable correction electric field distributions, or the controllable correction voltage distributions, wherein the controllable correction charge distributions are different from each other, the controllable correction electric field distributions are different from each other, and the controllable correction voltage distributions are different from each other. The processing device 140 obtains a set of calibration parameters according the set of the controllable correction charge distributions, the set of the controllable correction electric field distribution or the set of the controllable correction voltage distribution measured by the sensing probe P1. The processing device 140 corrects the charge distribution, the electric field distribution, or the voltage distribution on the plurality of light-emitting diodes 10 measured by the sensing probe according to the set of the calibration parameters. This can eliminate a measurement error introduced by the inspection apparatus 100F itself, such as but not limited to: an error introduced by the uneven thickness T of the medium layer 120.

For example, in this embodiment, the calibration sheet 180 may be a complete electrode sheet. The voltage source VS can be electrically connected to the calibration sheet 180 and the conductive layer 130 of the photoelectric sensing structure S, so that the calibration voltage distribution is generated, which is not limited in the disclosure.

Figure 20:
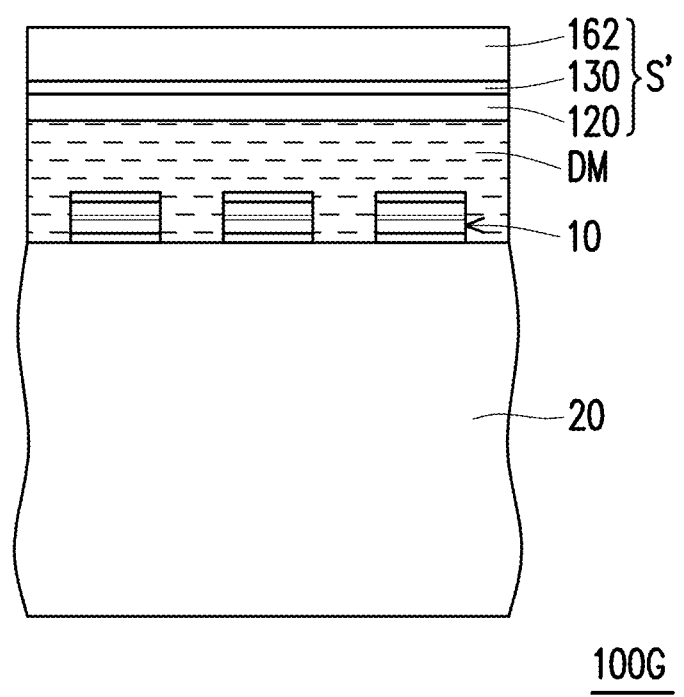
FIG. 20 is a partially enlarged schematic view of an inspection apparatus 100G according to an embodiment of the disclosure.

FIG. 20 is a partially enlarged schematic view of an inspection apparatus 100G according to an embodiment of the disclosure. The inspection apparatus 100G of FIG. 20 is similar to the aforementioned inspection apparatus 100F of FIG. 13, and the difference between the two is that: in the embodiment of FIG. 20, the photoelectric sensing structure S' may not have the first substrate 161. The medium layer 120 can be replace by the medium layer 120' (not shown). The medium layer 120' is the mixture of the polymer and electro-optical material, which may be a film layer capable of changing optical property affecting by the electric field E, the charge, or the voltage. Furthermore, when the inspection apparatus 100G inspects by the photoelectric sensing structure S', the dielectric material DM disposed between photoelectric sensing structure S' and the plurality of light-emitting diodes 10, or on the plurality of light-emitting diodes 10, may be a liquid with a high dielectric constant, such as but not limited to: deionization water.

Figure 21A:
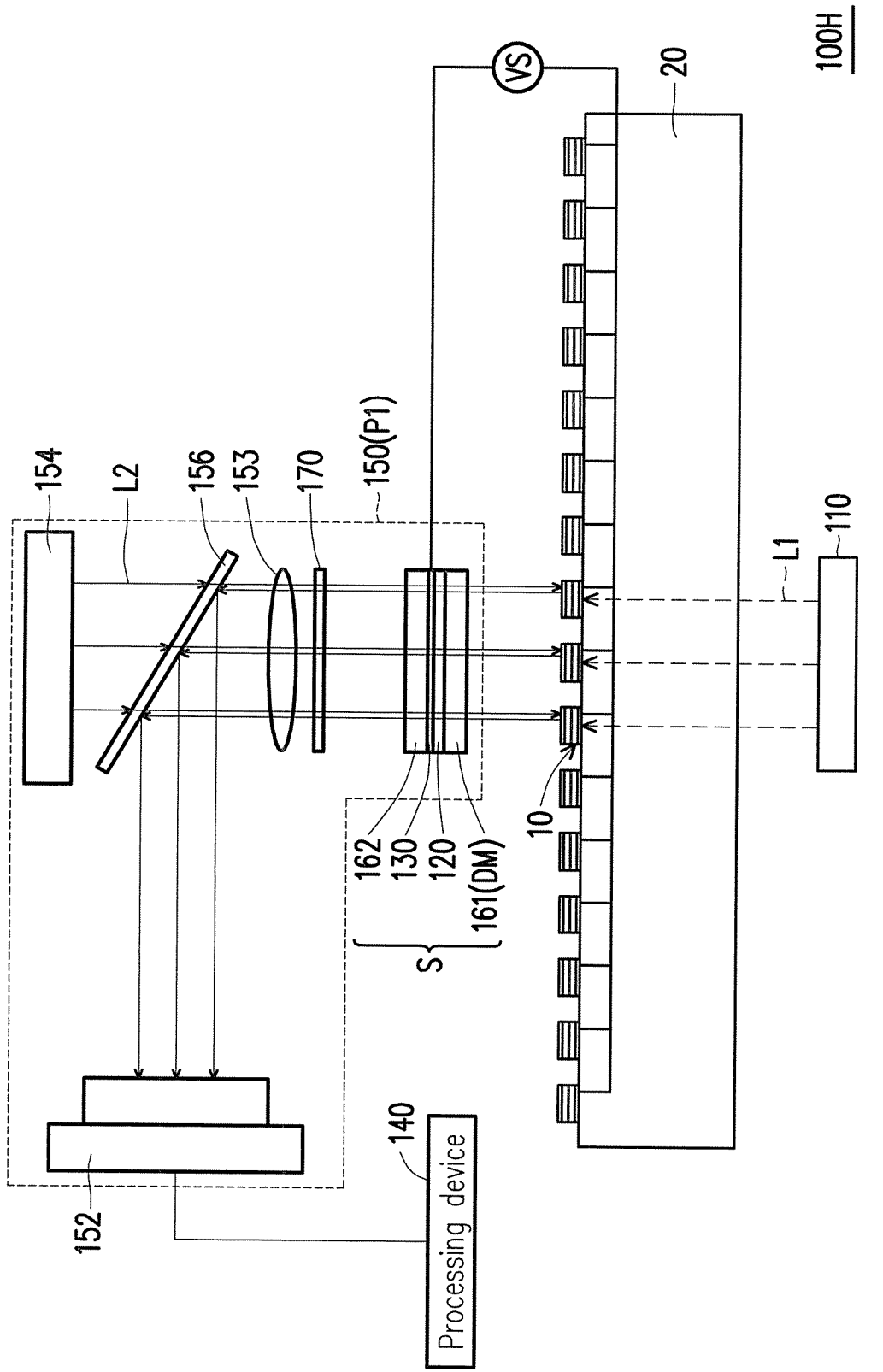
FIG. 21A is a schematic view of an inspection apparatus 100H according to an embodiment of the disclosure.

FIG. 21A is a schematic view of an inspection apparatus 100H according to an embodiment of the disclosure. The inspection apparatus 100H of FIG. 21A is similar to the aforementioned inspection apparatus 100F of FIG. 13, and the difference between the two is that: in the embodiment of FIG. 13, a voltage supplier VS is connected to the conductive layer 130 and a plurality of electrodes 13a (refer to FIG. 2) of the plurality of light-emitting diodes 10. The voltage supplier VS provides a DC bias voltage or an AC square wave bias voltage. In the embodiment, the two electrodes 13a and 13b of the LED 10 can be respectively disposed on two opposite sides. It is vertical structure. A plurality of electrodes 13a may be connected together by groups. Some pads or electrodes for one group will be deposited on the surface of the carrier 20 and can be electrically connected to the outside points. In the embodiment of FIG. 21A, it exists a voltage supplier VS to provide a bias voltage between the conductive layer 130 and a plurality of electrodes 13a of the plurality of light-emitting diodes 10. In the embodiment, the medium layer 120 with high operation voltage, the bias voltage can help the medium layer 120 to operate in workable region and sensing the voltage or electric field changes of the plurality of light-emitting diodes 10.

Figure 21B:
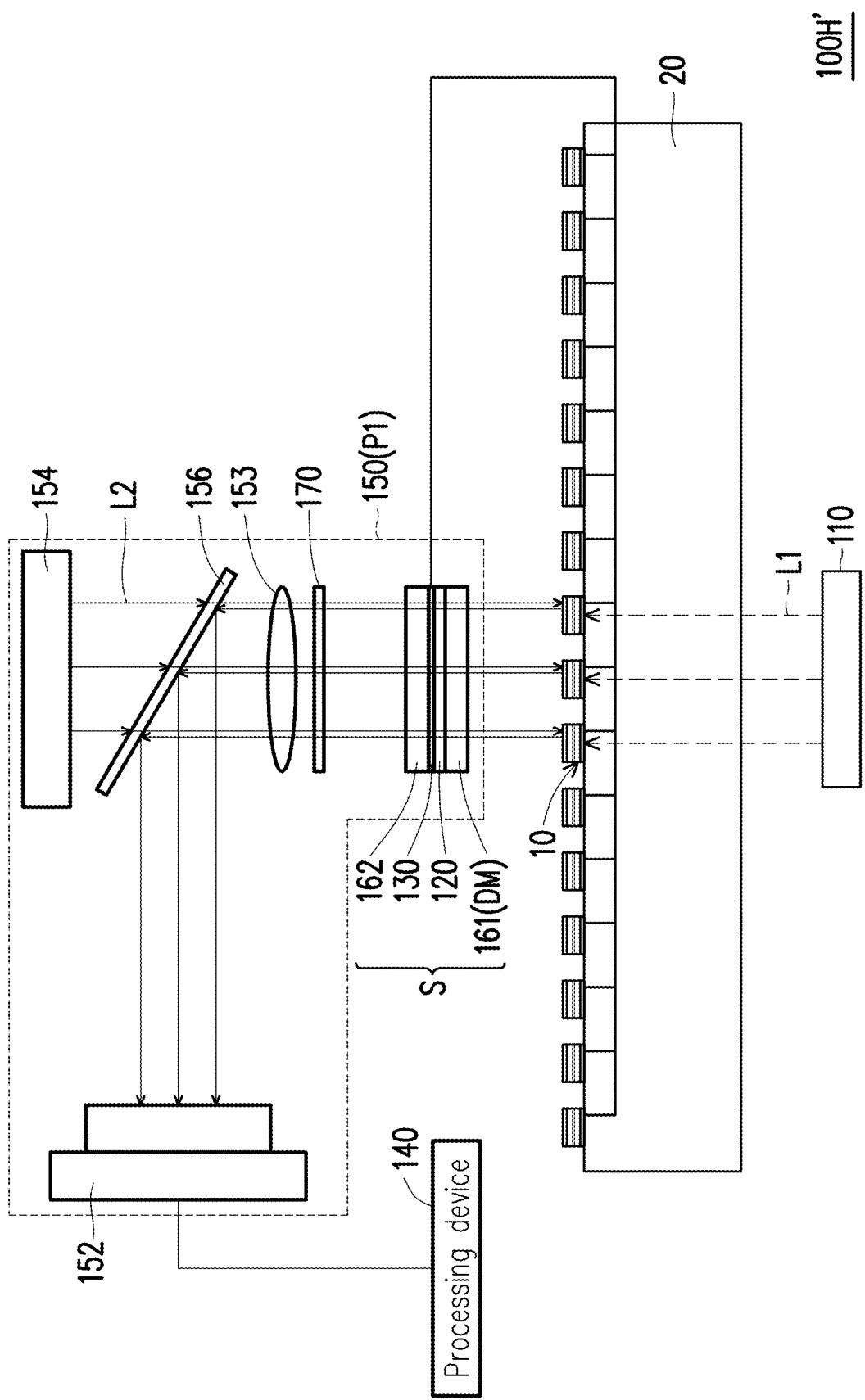
FIG. 21B is a schematic view of an inspection apparatus 100H' according to an embodiment of the disclosure.
Figure 22:
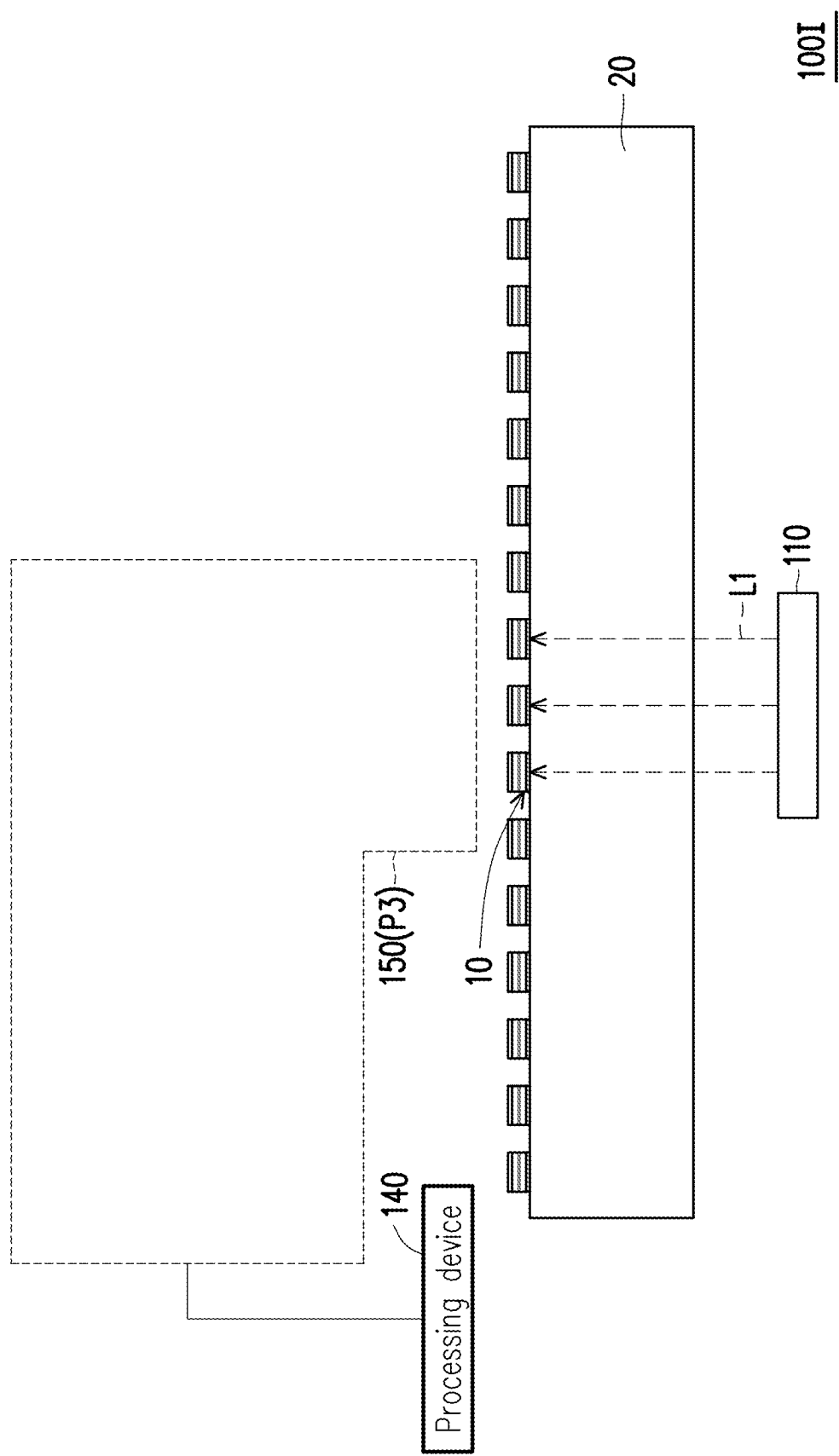
FIG. 22 is a schematic view of an inspection apparatus 100I according to an embodiment of the disclosure.

FIG. 21B is a schematic view of an inspection apparatus 100H' according to an embodiment of the disclosure. The inspection apparatus 100H' of FIG. 21B is similar to the aforementioned inspection apparatus 100H of FIG. 21A, and the difference between the two is that: in the embodiment of FIG. 21B, the conductive layer 130 and a plurality of electrodes 13a of the plurality of light-emitting diodes 10 are connected together and they are in the same electric potential. FIG. 22 is a schematic view of an inspection apparatus 100I according to an embodiment of the disclosure. The inspection apparatus 100I of FIG. 22 is similar to the inspection apparatus 100F of FIG. 13, and the differences between the two are described below. The two are the same or similar, please refer to the previous description, and will not be repeated here.

Figure 23:
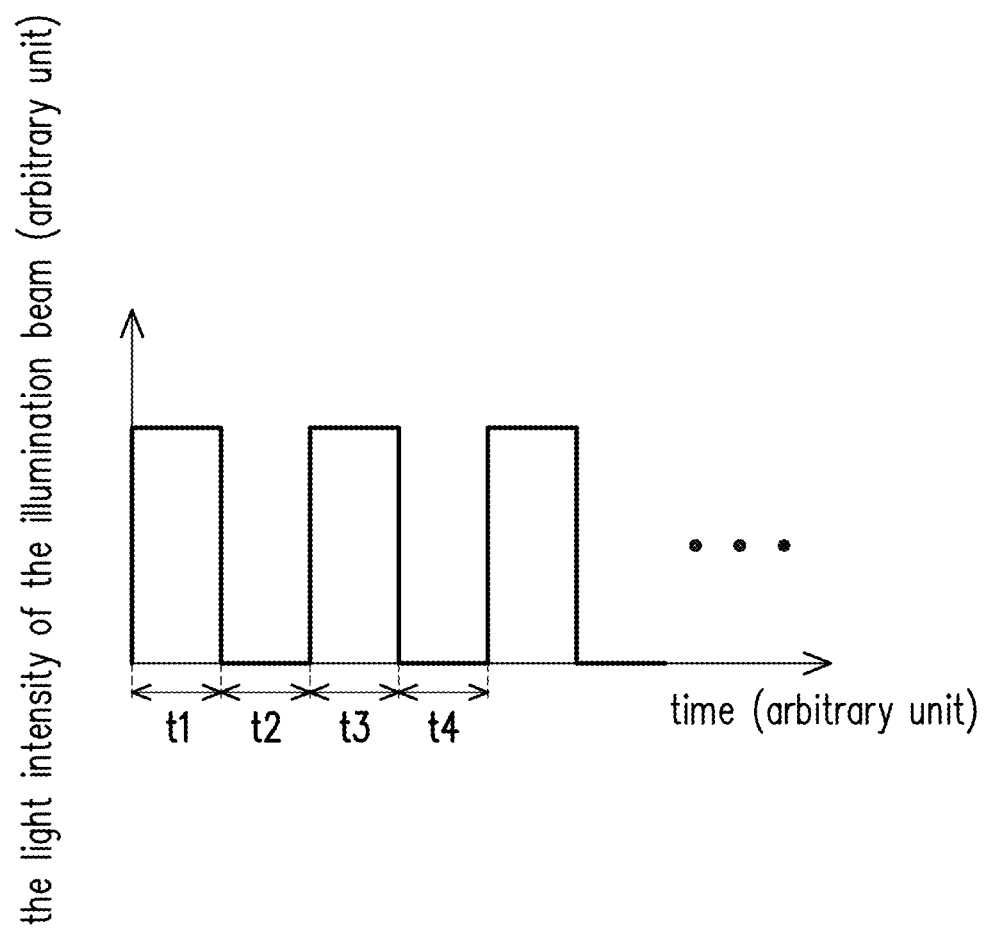
FIG. 23 is a relationship between a light intensity of an illumination beam L1 of the inspection apparatus 100I and a time according to an embodiment of the disclosure.

FIG. 23 shows a relationship between a light intensity of an illumination beam L1 of the inspection apparatus 100I and a time according to an embodiment of the disclosure.

Referring to FIG. 22 and FIG. 23, in this embodiment, the light intensity of the illumination beam L1 will change with time. For example, the illumination light source 110 configured to emit the illumination beam L1 can be turned on or off over time (i.e., the illumination light source 110 configured to emit the illumination beam L1 can be turned on in a first period t1, turned off in a second period t2 following the first period t1, turned on in a third period t3 following the second period t2, and turned off in a fourth period t4 following the period t3, so on.)

Since the light intensity of the illumination beam L1 changes with time, the charge distribution, electric field distribution, or voltage distribution on the plurality of light-emitting diodes 10 simultaneously illuminated by the illumination beam L1 also changes with time. The charge distribution, the electric field distribution or the voltage distribution changing with time on the plurality of light-emitting diodes 10 causes a magnetic field distribution. The sensing probe P3 can measure the magnetic field distribution. The processing device 140 determines a plurality of electro-optical characteristics of the plurality of light-emitting diodes 10 according the magnetic field distribution.

For example, in this embodiment, the sensing probe P3 may include a plurality of magnetic sensors. In the embodiment, the illumination light beam L1 whose intensity changes with time irradiate the plurality of light-emitting diodes 10, for example the magnetic sensors are induction coils. If an induction coil of the sensing probe P3 generates an induced current or an induced current exceeding a predetermined current value. The processing device 140 determines that a light-emitting diode 10 corresponding to the induction coil is normal. If an induction coil of the sensing probe P3 doesn't generate an induced current or an induced current exceeding a predetermined current value. The processing device 140 determines that a light-emitting diode 10 corresponding to the induction coil is abnormal.

Figure 24:
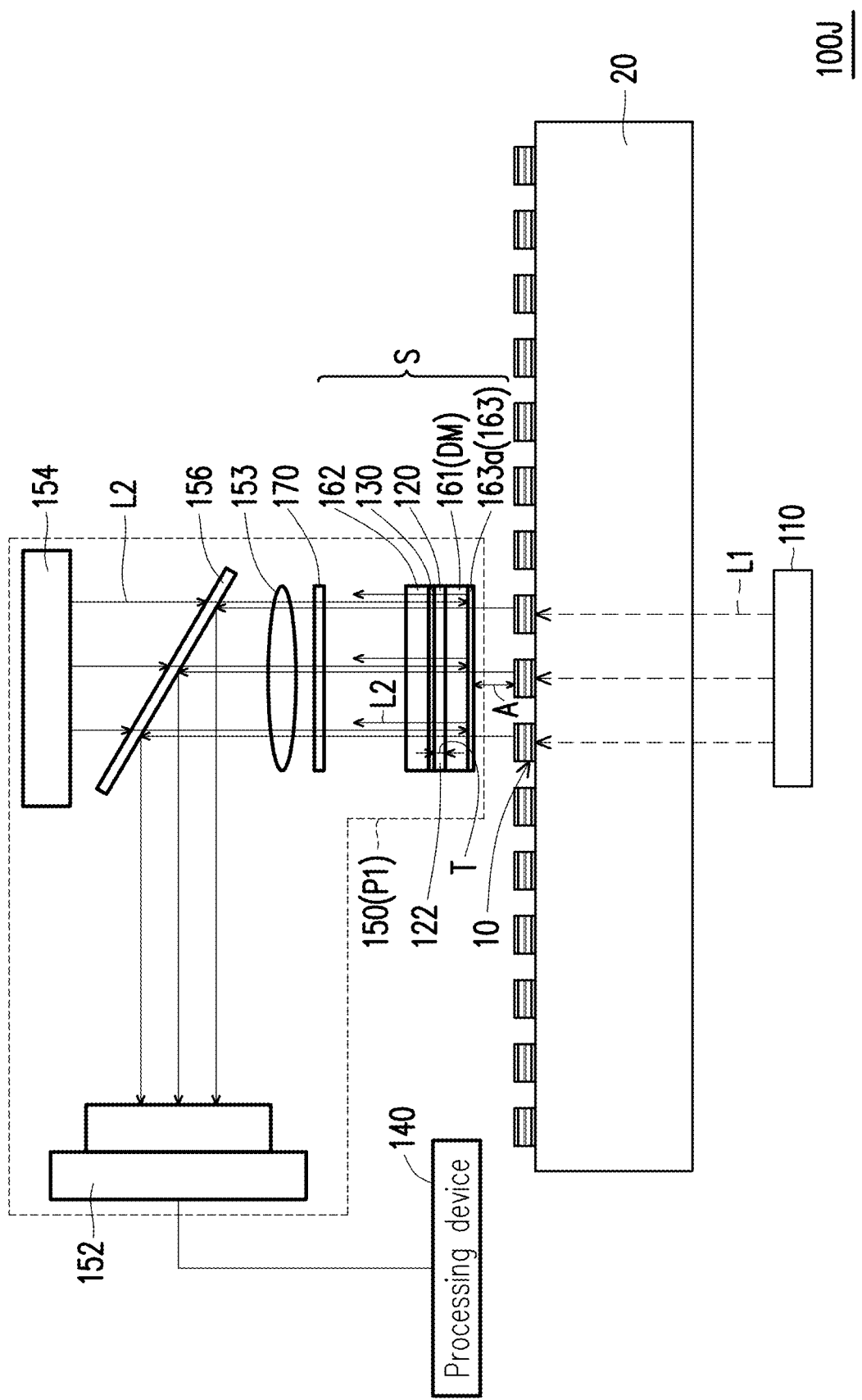
FIG. 24 is a schematic view of an inspection apparatus 100J according to an embodiment of the disclosure.

FIG. 24 is a schematic view of an inspection apparatus 100J according to an embodiment of the disclosure. The inspection apparatus 100J of FIG. 24 is similar to the aforementioned inspection apparatus 100F of FIG. 13, and the difference between the two is that: a photoelectric sensing structure S of the inspection apparatus 100J of FIG. 24 further includes an optical layer 163. Referring to FIG. 24, the first substrate 161 is disposed between the medium layer 120 and the optical layer 163. In this embodiment, the optical layer 163 may be a reflection layer 163a which can reflect the imaging beam L2 (passing through the medium layer 120). For example, a reflectance of optical layer 163 is preferably equal to or larger than 90% or 99%.

Figure 25:
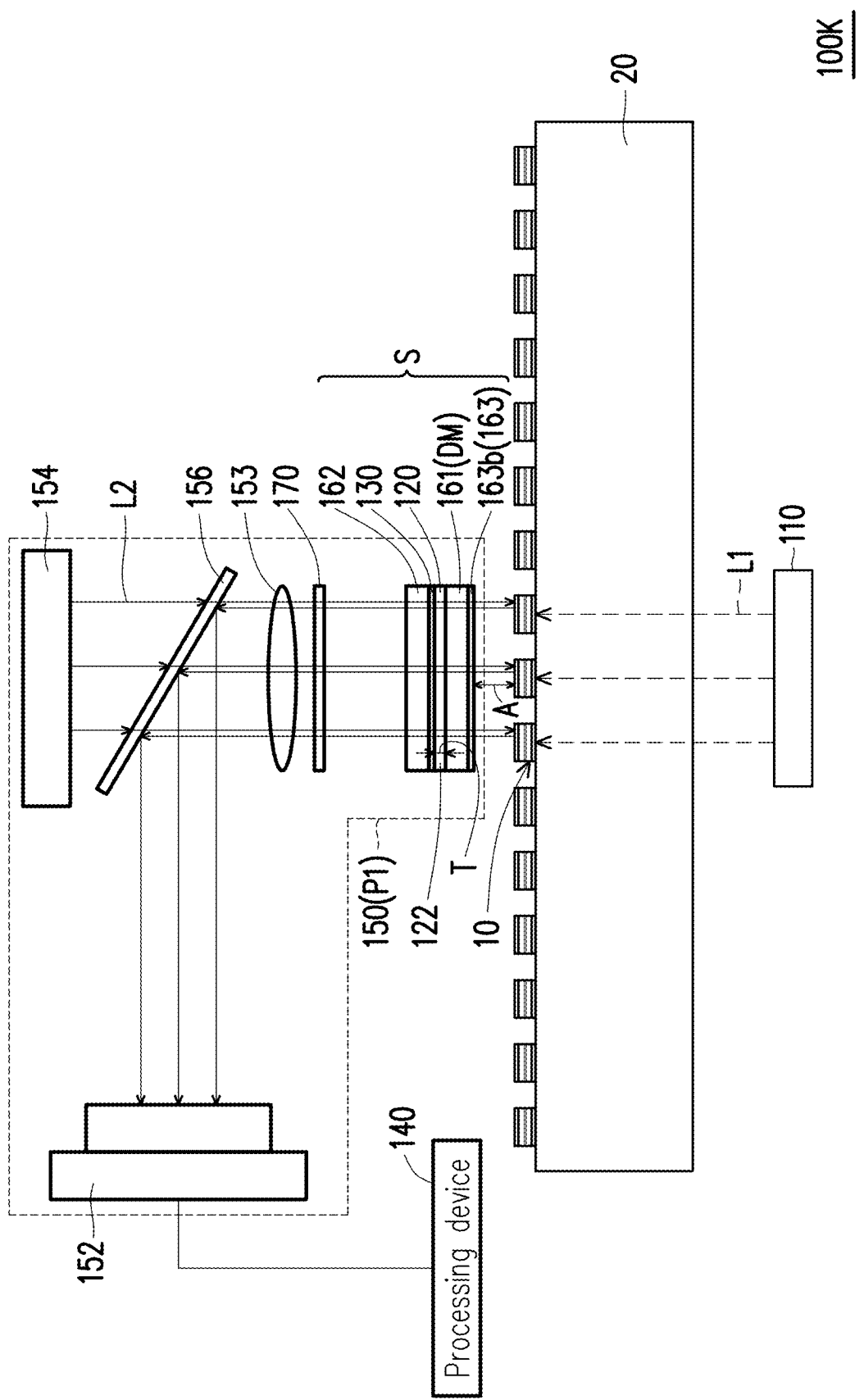
FIG. 25 is a schematic view of an inspection apparatus 100K according to an embodiment of the disclosure.

FIG. 25 is a schematic view of an inspection apparatus 100K according to an embodiment of the disclosure. The inspection apparatus 100K of FIG. 25 is similar to the aforementioned inspection apparatus 100F of FIG. 13, and the difference between the two is that: a photoelectric sensing structure S of the inspection apparatus 100K of FIG. 25 further includes an optical layer 163. Referring to FIG. 25, the first substrate 161 is disposed between the medium layer 120 and the optical layer 163. In this embodiment, the optical layer 163 may be a optical layer 163b having a high transmittance. For example, the transmittance of the optical layer 163b is preferably equal to or larger than 90% or 99%. The optical layer 163b is disposed below the medium layer 120 and located between the plurality of light-emitting diodes 10 and the medium layer 120. The imaging beam L2 can pass through the optical layer 163b and can be reflected by the electrodes of the plurality of light-emitting diodes 10.

To sum up, in the method for inspecting the LEDs and the inspection apparatus provided in one or more embodiments of the disclosure, the illumination beam is applied to simultaneously irradiate the LEDs, and a sensing probe is applied to measure the charge distribution, the electric field distribution, or the voltage distribution on the LEDs, so as to determine the electro-optical characteristics of the LEDs. As such, a significant amount of LEDs can be rapidly inspected.

Although the disclosure has been disclosed in the above embodiments, it is not intended to limit the disclosure. Those skilled in the art can make some modifications and refinements without departing from the spirit and scope of the disclosure. Hence, the scope of the disclosure is defined by the scope of the appended claims.

What is claimed is:

1. An inspection apparatus configured to inspect a plurality of light-emitting diodes and comprising:
   an illumination light source emitting an illumination beam to simultaneously irradiate the plurality of light-emitting diodes;
   a sensing probe configured to measure a charge distribution, an electric field distribution, or a voltage distribution on the plurality of light-emitting diodes simultaneously irradiated by the illumination beam; and
   a processing device determining a plurality of electro-optical characteristics of the plurality of light-emitting diodes through the charge distribution, the electric field distribution, or the voltage distribution on the plurality of light-emitting diodes simultaneously irradiated by the illumination beam;
   wherein the illumination beam has a sufficient light intensity so that the charge distribution, the electric field distribution, or the voltage distribution on the plurality of light-emitting diodes simultaneously illuminated by the illumination beam are close to a saturation charge distribution, a saturation electric field distribution or a saturation voltage distribution, respectively;
   the sensing probe is used to measure the charge distribution, the electric field distribution or the voltage distribution on the plurality of light-emitting diodes simultaneously illuminated by the illumination beam;
   the processing device determines luminous energies of the plurality of light-emitting diodes operated under a constant current according to the charge distribution, the electric field distribution or the voltage distribution on the plurality of light-emitting diodes simultaneously illuminated by the illumination beam.

2. The inspection apparatus according to claim 1, wherein the illumination beam has the sufficient light intensity,
   a curve shows a relationship between a light intensity of the illumination beam and a voltage on one of the plurality of light-emitting diodes;
   the curve has a first region, a second region after the first region and a third region after the second region;
   in the first region of the curve, the voltage on the one of the plurality of light-emitting diodes and the light intensity of the illumination beam have a linear relationship with the largest slope in the whole curve;
   in the second region, a slope of a point of the curve change from a larger slope to a smaller slope with increasing of the light intensity of the illumination beam;
   in the third region, the voltage on the one of the plurality of light-emitting diodes increases slowly with the light intensity of the illumination beam, and a slope of a point in the third region is the smallest one in the whole curve;
   a point of the curve on a junction of the second region and the third region is called a turning point;
   the sufficient light intensity is equal to or larger than a light intensity Ia of the turning point.

3. The inspection apparatus according to claim 2, wherein the sufficient light intensity of the illumination beam is equal to or larger than 5·Ia.

4. The inspection apparatus according to claim 1, wherein the sensing probe further comprises:
   a medium layer adjoining the plurality of light-emitting diodes and adapted to be affected by an electric field, a charge, or a voltage to induce a corresponding optical property change, wherein the medium layer has a plurality of inspection regions respectively corresponding to the plurality of light-emitting diodes; and
   an optical-electro sensor obtaining an image of the plurality of inspection regions of the medium layer, wherein the processing device and the optical-electro sensor are electrically connected, and the processing device determines the plurality of electro-optical characteristics of the plurality of light-emitting diodes according to the image of the plurality of inspection regions of the medium layer.

5. The inspection apparatus according to claim 4, wherein the plurality of light-emitting diodes comprise a plurality of vertical light-emitting diodes, and the inspection apparatus further comprises:
   a conductive layer, wherein the medium layer is disposed between the conductive layer and the plurality of vertical light-emitting diodes.

6. The inspection apparatus according to claim 5, wherein each of the plurality of vertical light-emitting diodes includes a first-type semiconductor layer, a second-type semiconductor layer, an active layer, a first electrode and a second electrode, the active layer is disposed between the first-type semiconductor layer and the second-type semiconductor layer, the first electrode is adjacent to the first-type semiconductor layer, the second electrode is adjacent to the second-type semiconductor layer, and the conductive layer is electrically connected to first electrodes of the plurality of vertical light-emitting diodes.

7. The inspection apparatus according to claim 5, wherein each of the plurality of vertical light-emitting diodes includes a first-type semiconductor layer, a second-type semiconductor layer, an active layer, a first electrode and a second electrode, the active layer is disposed between the first-type semiconductor layer and the second-type semiconductor layer, the first electrode is adjacent to the first-type semiconductor layer, the second electrode is adjacent to the second-type semiconductor layer, and a voltage supplier is connected to the conductive layer and first electrodes of the plurality of vertical light-emitting diodes.

8. The inspection apparatus according to claim 7, wherein the voltage supplier provides a DC bias voltage or an AC square wave bias voltage.

9. The inspection apparatus according to claim 4, wherein the corresponding optical property change of the medium layer induced by the electric field, the charge, or the voltage has a threshold value; the processing device determines whether a light-emitting diode of the plurality of light-emitting diodes corresponding to an inspection region of the plurality of inspection regions is normal according to whether the corresponding optical property change occurs in the inspection region.

10. The inspection apparatus according to claim 4, wherein the processing device can classify one of the plurality of light-emitting diodes in groups according to an amount of the optical property change corresponding to an inspection region of the plurality of inspection regions based on application requirements of an end product.

11. The inspection apparatus according to claim 4, wherein the sensing probe further comprises:
    an image capturing light source configured to emit an image capturing beam, wherein the image capturing beam is configured to irradiate the medium layer.

12. The inspection apparatus according to claim 11, wherein the sensing probe further comprises:
    a long pass filter disposed between the medium layer and the optical-electro sensor, wherein the long pass filter blocks at least one of the illumination beam and a light beam emitted by the light-emitting diodes, the light beam emitted by the light-emitting diodes is caused due to a photoluminescence effect, and the image capturing beam can pass through the long pass filter.

13. The inspection apparatus according to claim 11, wherein the image capturing light source is a monochromatic light source.

14. The inspection apparatus according to claim 11, wherein the medium layer is a liquid crystal layer, and the sensing probe further comprises:
a first polarizing device and a second polarizing device, wherein the first polarizing device is used to control a polarization direction of the image capturing light source, the second polarizing device is used to control the polarization direction of the image capturing light beam accepted by the optical-electro sensor, and a transmission axis of the first polarizing device and a transmission axis of the second polarizing device are perpendicular to each other;
an alignment layer dispose beside the liquid crystal layer, wherein there is a specific angle between the transmission axis of the first polarizing device and a rubbing direction of the alignment layer.

15. The inspection apparatus according to claim 4, wherein the sensing probe further comprises:
a reflective layer disposed below the medium layer and located between the plurality of light-emitting diodes and the medium layer, wherein a reflectance of the reflective layer is larger than 90%.

16. The inspection apparatus according to claim 4, wherein the sensing probe further comprises:
an optical layer disposed below the medium layer and located between the plurality of light-emitting diodes and the medium layer, wherein a transmittance of the optical layer is larger than 90%.

17. The inspection apparatus according to claim 4, further comprises:
a dielectric material disposed between the medium layer and the plurality of light-emitting diodes, wherein a relative permittivity of the dielectric material is larger than 30.

18. The inspection apparatus according to claim 17, wherein the dielectric material is a substrate below the medium layer.

19. The inspection apparatus according to claim 17, furthermore comprises:
a liquid disposed on the plurality of light-emitting diodes, wherein a relative permittivity of the liquid is larger than 30.

20. The inspection apparatus according to claim 9, wherein the threshold value can be adjusted by changing at least one of a distance between the plurality of light-emitting diodes and a photoelectric sensing structure having the medium layer, a dielectric constant of an object disposed between the plurality of light-emitting diodes and the photoelectric sensing structure, a thickness of a substrate between the medium layer and the plurality of light-emitting diodes, a dielectric constant of the substrate between the medium layer and the plurality of light-emitting diodes, an thickness of the medium layer and a dielectric constant of the medium layer.

21. An inspection apparatus configured to inspect a plurality of light-emitting diodes and comprising:
an illumination light source emitting an illumination beam to simultaneously irradiate the plurality of light-emitting diodes;
a sensing probe configured to measure a charge distribution, an electric field distribution, or a voltage distribution on the plurality of light-emitting diodes simultaneously irradiated by the illumination beam; and
a processing device determining a plurality of electro-optical characteristics of the plurality of light-emitting diodes through the charge distribution, the electric field distribution, or the voltage distribution on the plurality of light-emitting diodes simultaneously irradiated by the illumination beam;
wherein a light intensity of the illumination beam changes with time, so that the charge distribution, the electric field distribution, or the voltage distribution on the plurality of light-emitting diodes change with time, and the charge distribution, the electric field distribution, or the voltage distribution that changes with time causes a magnetic field distribution;
the sensing probe measures the magnetic field distribution;
the processing device determines the plurality of electro-optical characteristics of the plurality of light-emitting diodes according the magnetic field distribution.

22. A method for inspecting light-emitting diodes, comprising:
emitting an illumination beam to simultaneously irradiate the plurality of light-emitting diodes;
measuring a charge distribution, an electric field distribution, or a voltage distribution on the plurality of light-emitting diodes simultaneously irradiated by the illumination beam;
determining a plurality of electro-optical characteristics of the plurality of light-emitting diodes through the charge distribution, the electric field distribution, or the voltage distribution on the plurality of light-emitting diodes simultaneously irradiated by the illumination beam; and
keeping a calibration sheet and a sensing probe at a fixed distance;
forming a set of controllable correction charge distributions, a set of controllable correction electric field distributions or a set of controllable correction voltage distributions by the calibration sheet;
measuring the set of the controllable correction charge distributions, the set of the controllable correction electric field distributions or the set of the controllable correction voltage distributions by the sensing probe;
obtaining a set of calibration parameters according the set of the controllable correction charge distributions, the set of the controllable correction electric field distributions or the set of the controllable correction voltage distributions; and
correcting the charge distribution, the electric field distribution, or the voltage distribution on the plurality of light-emitting diodes measured by the sensing probe according to the set of the calibration parameters.

23. The method for inspecting the light-emitting diodes according to claim 22, wherein the calibration sheet is an electrode sheet.

24. The method for inspecting the light-emitting diodes according to claim 22, wherein the sensing probe comprises:
a medium layer adjoining the plurality of light-emitting diodes and adapted to be affected by an electric field, a charge, or a voltage to induce a corresponding optical property change, wherein the medium layer has a plurality of inspection regions respectively corresponding to the plurality of light-emitting diodes; and an optical-electro sensor obtaining an image of the plurality of inspection regions of the medium layer, wherein the method for inspecting the light-emitting diodes further comprising:
determining the plurality of electro-optical characteristics of the plurality of light-emitting diodes according to the image of the plurality of inspection regions of the medium layer.

25. The method for inspecting the light-emitting diodes according to claim 24, wherein the plurality of light-emitting diodes comprise a plurality of vertical light-emitting diodes, and the method for inspecting the light-emitting diodes further comprising:
providing a conductive layer, wherein the medium layer is disposed between the conductive layer and the plurality of vertical light-emitting diodes.

26. The method for inspecting the light-emitting diodes according to claim 25, wherein each of the plurality of vertical light-emitting diodes includes a first-type semiconductor layer, a second-type semiconductor layer, an active layer, a first electrode and a second electrode, the active layer is disposed between the first-type semiconductor layer and the second-type semiconductor layer, the first electrode is adjacent to the first-type semiconductor layer, the second electrode is adjacent to the second-type semiconductor layer, and the conductive layer is electrically connected to first electrodes of the plurality of vertical light-emitting diodes.

27. The method for inspecting the light-emitting diodes according to claim 24, wherein the corresponding optical property change of the medium layer induced by the electric field, the charge, or the voltage has a threshold value; the method for inspecting the light-emitting diodes further comprising:
determining whether a light-emitting diode of the plurality of light-emitting diodes corresponding to an inspection region of the plurality of inspection regions is normal according to whether the corresponding optical property change occurs in the inspection region.

28. The method for inspecting the light-emitting diodes according to claim 24, wherein the sensing probe further comprises:
an image capturing light source configured to emit an image capturing beam, wherein the image capturing beam is configured to irradiate the medium layer.

29. The method for inspecting the light-emitting diodes according to claim 28, wherein the sensing probe further comprises:
a long pass filter disposed between the medium layer and the optical-electro sensor, wherein the long pass filter blocks at least one of the illumination beam and a light beam emitted by the light-emitting diodes, the light beam emitted by the light-emitting diodes is caused due to a photoluminescence effect, and the image capturing beam can pass through the long pass filter.

30. The method for inspecting the light-emitting diodes according to claim 24, wherein the sensing probe further comprises:
a reflective layer disposed below the medium layer and located between the plurality of light-emitting diodes and the medium layer, wherein a reflectance of the reflective layer is larger than 90%.

31. The method for inspecting the light-emitting diodes according to claim 24, wherein the sensing probe further comprises:
an optical layer disposed below the medium layer and located between the plurality of light-emitting diodes and the medium layer, wherein a transmittance of the optical layer is larger than 90%.

32. The method for inspecting the light-emitting diodes according to claim 24 further comprises:
providing a dielectric material disposed between the medium layer and the plurality of light-emitting diodes, wherein a relative permittivity of the dielectric material is larger than 30.

* * * * *